(12) United States Patent
Vorbach et al.

(10) Patent No.: US 7,650,448 B2
(45) Date of Patent: Jan. 19, 2010

(54) I/O AND MEMORY BUS SYSTEM FOR DFPS AND UNITS WITH TWO- OR MULTI-DIMENSIONAL PROGRAMMABLE CELL ARCHITECTURES

(75) Inventors: Martin Vorbach, Karlsruhe (DE); Robert Münch, Karlsruhe (DE)

(73) Assignee: Pact XPP Technologies AG, Munich (DE)

( * ) Notice: Subject to any disclaimer, the term of this patent is extended or adjusted under 35 U.S.C. 154(b) by 80 days.

(21) Appl. No.: 12/008,543

(22) Filed: Jan. 10, 2008

(65) Prior Publication Data

US 2008/0222329 A1 Sep. 11, 2008

Related U.S. Application Data

(63) Continuation of application No. 10/792,168, filed on Mar. 2, 2004, now Pat. No. 7,243,175, which is a continuation of application No. 10/304,252, filed on Nov. 26, 2002, now Pat. No. 6,721,830, which is a continuation of application No. 09/915,213, filed on Jul. 25, 2001, now Pat. No. 6,513,077, which is a continuation of application No. 09/335,974, filed on Jun. 18, 1999, now Pat. No. 6,338,106, which is a continuation of application No. PCT/DE97/03013, filed on Dec. 21, 1997, and a continuation-in-part of application No. 08/947,254, filed on Oct. 8, 1997, now Pat. No. 6,119,181.

(30) Foreign Application Priority Data

Dec. 20, 1996 (DE) ................................. 196 54 595

(51) Int. Cl.
*G06F 15/76* (2006.01)
(52) U.S. Cl. ........................ 710/100; 710/316; 710/305; 712/11
(58) Field of Classification Search ................. 710/100, 710/305, 316, 8, 72; 716/16; 712/11, 14, 712/18
See application file for complete search history.

(56) References Cited

U.S. PATENT DOCUMENTS 2,067,477 A 1/1937 Cooper
3,242,998 A 3/1966 Gubbins (Continued)

FOREIGN PATENT DOCUMENTS

DE 42 21 278 1/1994

(Continued)

OTHER PUBLICATIONS

Abnous et al., "Ultra-Low-Power Domain-Specific Multimedia Processors," U.C. Berkeley, 1996 IEEE, pp. 461-470.

(Continued)

*Primary Examiner*—Glenn A Auve
(74) *Attorney, Agent, or Firm*—Kenyon & Kenyon LLP

(57) ABSTRACT

A general bus system is provided which combines a number of internal lines and leads them as a bundle to the terminals. The bus system control is predefined and does not require any influence by the programmer. Any number of memories, peripherals or other units can be connected to the bus system (for cascading).

78 Claims, 19 Drawing Sheets

U.S. PATENT DOCUMENTS

| | | |
|---|---|---|
| 3,681,578 A | 8/1972 | Stevens |
| 3,757,608 A | 9/1973 | Willner |
| 3,855,577 A | 12/1974 | Vandierendonck |
| 4,233,667 A | 11/1980 | Devine et al. |
| 4,414,547 A | 11/1983 | Knapp et al. |
| 4,498,134 A | 2/1985 | Hansen et al. |
| 4,498,172 A | 2/1985 | Bhavsar |
| 4,566,102 A | 1/1986 | Hefner |
| 4,590,583 A | 5/1986 | Miller |
| 4,591,979 A | 5/1986 | Iwashita |
| 4,663,706 A | 5/1987 | Allen et al. |
| 4,667,190 A | 5/1987 | Fant et al. |
| 4,682,284 A | 7/1987 | Schrofer |
| 4,686,386 A | 8/1987 | Tadao |
| 4,706,216 A | 11/1987 | Carter |
| 4,720,778 A | 1/1988 | Hall et al. |
| 4,720,780 A | 1/1988 | Dolecek |
| 4,739,474 A | 4/1988 | Holsztynski |
| 4,761,755 A | 8/1988 | Ardini et al. |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Miranker et al. |
| 4,870,302 A | 9/1989 | Freeman |
| 4,882,687 A | 11/1989 | Gordon |
| 4,884,231 A | 11/1989 | Mor et al. |
| 4,891,810 A | 1/1990 | de Corlieu et al. |
| 4,901,268 A | 2/1990 | Judd |
| 4,910,665 A | 3/1990 | Mattheyses et al. |
| 4,918,440 A | 4/1990 | Furtek et al. |
| 4,967,340 A | 10/1990 | Dawes |
| 4,972,314 A | 11/1990 | Getzinger et al. |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,034,914 A | 7/1991 | Osterlund |
| 5,041,924 A | 8/1991 | Blackborow et al. |
| 5,043,978 A | 8/1991 | Nagler et al. |
| 5,047,924 A | 9/1991 | Matsubara et al. |
| 5,065,308 A | 11/1991 | Evans |
| 5,072,178 A | 12/1991 | Matsumoto |
| 5,081,375 A | 1/1992 | Pickett et al. |
| 5,099,447 A | 3/1992 | Myszewski |
| 5,109,503 A | 4/1992 | Cruickshank et al. |
| 5,113,498 A | 5/1992 | Evan et al. |
| 5,115,510 A | 5/1992 | Okamoto et al. |
| 5,123,109 A | 6/1992 | Hillis |
| 5,125,801 A | 6/1992 | Nabity et al. |
| 5,128,559 A | 7/1992 | Steele |
| 5,142,469 A | 8/1992 | Weisenborn |
| 5,144,166 A | 9/1992 | Camarota et al. |
| 5,193,202 A | 3/1993 | Jackson et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,532 A | 2/1994 | Hunt |
| 5,294,119 A | 3/1994 | Vincent et al. |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,361,373 A | 11/1994 | Gilson |
| 5,379,444 A | 1/1995 | Mumme |
| 5,392,437 A | 2/1995 | Matter et al. |
| 5,410,723 A | 4/1995 | Schmidt et al. |
| 5,412,795 A | 5/1995 | Larson |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,440,245 A | 8/1995 | Galbraith et al. |
| 5,440,538 A | 8/1995 | Olsen et al. |
| 5,442,790 A | 8/1995 | Nosenchuck |
| 5,444,394 A | 8/1995 | Watson et al. |
| 5,448,186 A | 9/1995 | Kawata |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,497,498 A | 3/1996 | Taylor |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,525,971 A | 6/1996 | Flynn |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,570,040 A | 10/1996 | Lytle et al. |
| 5,574,930 A | 11/1996 | Halverson, Jr. et al. |
| 5,581,731 A | 12/1996 | King et al. |
| 5,583,450 A | 12/1996 | Trimberger et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |

| | | | | | | |
|---|---|---|---|---|---|---|
| 5,590,348 | A | 12/1996 | Phillips et al. | 5,892,370 A | 4/1999 | Eaton et al. |
| 5,596,742 | A | 1/1997 | Agarwal et al. | 5,892,961 A | 4/1999 | Trimberger |
| 5,600,265 | A | 2/1997 | El Gamal et al. | 5,892,962 A | 4/1999 | Cloutier |
| 5,600,845 | A | 2/1997 | Gilson | 5,901,279 A | 5/1999 | Davis, III |
| 5,611,049 | A | 3/1997 | Pitts | 5,915,123 A | 6/1999 | Mirsky et al. |
| 5,617,547 | A | 4/1997 | Feeney et al. | 5,924,119 A | 7/1999 | Sindhu et al. |
| 5,625,806 | A | 4/1997 | Kromer | 5,926,638 A | 7/1999 | Inoue |
| 5,625,836 | A | 4/1997 | Barker et al. | 5,927,423 A | 7/1999 | Wada et al. |
| 5,634,131 | A | 5/1997 | Matter et al. | 5,933,023 A | 8/1999 | Young |
| 5,646,544 | A | 7/1997 | Iadanza | 5,933,642 A | 8/1999 | Baxter et al. |
| 5,646,545 | A | 7/1997 | Trimberger et al. | 5,936,424 A | 8/1999 | Young et al. |
| 5,649,176 | A | 7/1997 | Selvidge et al. | 5,943,242 A | 8/1999 | Vorbach et al. |
| 5,649,179 | A | 7/1997 | Steenstra et al. | 5,956,518 A | 9/1999 | DeHon et al. |
| 5,652,529 | A | 7/1997 | Gould et al. | 5,960,193 A | 9/1999 | Guttag et al. |
| 5,652,894 | A | 7/1997 | Hu et al. | 5,960,200 A | 9/1999 | Eager et al. |
| 5,655,069 | A | 8/1997 | Ogawara et al. | 5,966,143 A | 10/1999 | Breternitz, Jr. |
| 5,655,124 | A | 8/1997 | Lin | 5,966,534 A | 10/1999 | Cooke et al. |
| 5,657,330 | A | 8/1997 | Matsumoto | 5,970,254 A | 10/1999 | Cooke et al. |
| 5,659,797 | A | 8/1997 | Zandveld et al. | 5,978,260 A | 11/1999 | Trimberger et al. |
| 5,675,743 | A | 10/1997 | Mavity | 5,978,583 A | 11/1999 | Ekanadham et al. |
| 5,675,757 | A | 10/1997 | Davidson et al. | 5,996,083 A | 11/1999 | Gupta et al. |
| 5,680,583 | A | 10/1997 | Kuijsten | 5,999,990 A | 12/1999 | Sharrit et al. |
| 5,694,602 | A | 12/1997 | Smith | 6,003,143 A | 12/1999 | Kim et al. |
| 5,713,037 | A | 1/1998 | Wilkinson et al. | 6,011,407 A | 1/2000 | New |
| 5,717,943 | A | 2/1998 | Barker et al. | 6,014,509 A | 1/2000 | Furtek et al. |
| 5,732,209 | A | 3/1998 | Vigil et al. | 6,020,758 A | 2/2000 | Patel et al. |
| 5,734,921 | A | 3/1998 | Dapp et al. | 6,020,760 A | 2/2000 | Sample et al. |
| 5,737,516 | A | 4/1998 | Circello et al. | 6,021,490 A | 2/2000 | Vorbach et al. |
| 5,737,565 | A | 4/1998 | Mayfield | 6,023,564 A | 2/2000 | Trimberger |
| 5,742,180 | A | 4/1998 | Detton et al. | 6,023,742 A | 2/2000 | Ebeling et al. |
| 5,745,734 | A * | 4/1998 | Craft et al. .............. 716/16 | 6,026,481 A | 2/2000 | New et al. |
| 5,748,872 | A | 5/1998 | Norman | 6,034,538 A | 3/2000 | Abramovici |
| 5,748,979 | A | 5/1998 | Trimberger | 6,035,371 A | 3/2000 | Magloire |
| 5,752,035 | A | 5/1998 | Trimberger | 6,038,650 A | 3/2000 | Vorbach et al. |
| 5,754,459 | A | 5/1998 | Telikepalli | 6,038,656 A | 3/2000 | Cummings et al. |
| 5,754,820 | A | 5/1998 | Yamagami | 6,044,030 A | 3/2000 | Zheng et al. |
| 5,754,827 | A | 5/1998 | Barbier et al. | 6,047,115 A | 4/2000 | Mohan et al. |
| 5,754,871 | A | 5/1998 | Wilkinson et al. | 6,049,222 A | 4/2000 | Lawman |
| 5,760,602 | A | 6/1998 | Tan | 6,052,773 A | 4/2000 | DeHon et al. |
| 5,761,484 | A | 6/1998 | Agarwal et al. | 6,054,873 A | 4/2000 | Laramie |
| 5,773,994 | A | 6/1998 | Jones | 6,055,619 A | 4/2000 | North et al. |
| 5,778,439 | A | 7/1998 | Trimberger et al. | 6,058,469 A | 5/2000 | Baxter |
| 5,781,756 | A | 7/1998 | Hung | 6,077,315 A | 6/2000 | Greenbaum et al. |
| 5,784,636 | A | 7/1998 | Rupp | 6,081,903 A | 6/2000 | Vorbach et al. |
| 5,794,059 | A | 8/1998 | Barker et al. | 6,084,429 A | 7/2000 | Trimberger |
| 5,794,062 | A | 8/1998 | Baxter | 6,085,317 A | 7/2000 | Smith |
| 5,801,547 | A | 9/1998 | Kean | 6,086,628 A | 7/2000 | Dave et al. |
| 5,801,715 | A | 9/1998 | Norman | 6,088,795 A | 7/2000 | Vorbach et al. |
| 5,801,958 | A | 9/1998 | Dangelo et al. | 6,092,174 A | 7/2000 | Roussakov |
| 5,802,290 | A | 9/1998 | Casselman | 6,105,105 A | 8/2000 | Trimberger et al. |
| 5,815,715 | A | 9/1998 | Kucukcakar | 6,105,106 A | 8/2000 | Manning |
| 5,821,774 | A | 10/1998 | Veytsman et al. | 6,108,760 A | 8/2000 | Mirsky et al. |
| 5,828,229 | A | 10/1998 | Cliff et al. | 6,119,181 A | 9/2000 | Vorbach et al. |
| 5,828,858 | A | 10/1998 | Athanas et al. | 6,122,719 A | 9/2000 | Mirsky et al. |
| 5,831,448 | A | 11/1998 | Kean | 6,125,408 A | 9/2000 | McGee et al. |
| 5,838,165 | A | 11/1998 | Chatter | 6,127,908 A | 10/2000 | Bozler et al. |
| 5,841,973 | A | 11/1998 | Kessler et al. | 6,134,166 A | 10/2000 | Lytle et al. |
| 5,844,422 | A | 12/1998 | Trimberger et al. | 6,137,307 A | 10/2000 | Iwanczuk et al. |
| 5,844,888 | A | 12/1998 | Markkula, Jr. et al. | 6,150,837 A | 11/2000 | Beal et al. |
| 5,848,238 | A | 12/1998 | Shimomura et al. | 6,150,839 A | 11/2000 | New et al. |
| 5,854,918 | A | 12/1998 | Baxter | 6,154,048 A | 11/2000 | Iwanczuk et al. |
| 5,857,097 | A | 1/1999 | Henzinger et al. | 6,154,049 A | 11/2000 | New |
| 5,859,544 | A | 1/1999 | Norman | 6,157,214 A | 12/2000 | Marshall |
| 5,862,403 | A | 1/1999 | Kanai et al. | 6,170,051 B1 | 1/2001 | Dowling |
| 5,865,239 | A | 2/1999 | Carr | 6,172,520 B1 | 1/2001 | Lawman et al. |
| 5,867,691 | A | 2/1999 | Shiraishi | 6,173,434 B1 | 1/2001 | Wirthlin et al. |
| 5,867,723 | A | 2/1999 | Peters et al. | 6,185,256 B1 | 2/2001 | Saito et al. |
| 5,870,620 | A | 2/1999 | Kadosumi et al. | 6,185,731 B1 | 2/2001 | Maeda et al. |
| 5,884,075 | A | 3/1999 | Hester et al. | 6,188,240 B1 | 2/2001 | Nakaya |
| 5,887,162 | A | 3/1999 | Williams et al. | 6,198,304 B1 | 3/2001 | Sasaki |
| 5,887,165 | A | 3/1999 | Martel et al. | 6,201,406 B1 | 3/2001 | Iwanczuk et al. |
| 5,889,533 | A | 3/1999 | Lee | 6,202,182 B1 | 3/2001 | Abramovici et al. |
| 5,889,982 | A | 3/1999 | Rodgers et al. | 6,204,687 B1 | 3/2001 | Schultz et al. |

| | | | | | | |
|---|---|---|---|---|---|---|
| 6,211,697 B1 | 4/2001 | Lien et al. | | 6,526,520 B1 | 2/2003 | Vorbach et al. |
| 6,212,650 B1 | 4/2001 | Guccione | | 6,538,468 B1 | 3/2003 | Moore |
| 6,215,326 B1 | 4/2001 | Jefferson et al. | | 6,539,415 B1 | 3/2003 | Mercs |
| 6,216,223 B1 | 4/2001 | Revilla et al. | | 6,539,438 B1 | 3/2003 | Ledzius et al. |
| 6,219,833 B1 | 4/2001 | Solomon et al. | | 6,539,477 B1 | 3/2003 | Seawright |
| RE37,195 E | 5/2001 | Kean | | 6,542,394 B2 | 4/2003 | Marshall et al. |
| 6,230,307 B1 | 5/2001 | Davis et al. | | 6,542,844 B1 | 4/2003 | Hanna |
| 6,240,502 B1 | 5/2001 | Panwar et al. | | 6,542,998 B1 | 4/2003 | Vorbach et al. |
| 6,243,808 B1 | 6/2001 | Wang | | 6,553,395 B2 | 4/2003 | Marshall et al. |
| 6,252,792 B1 | 6/2001 | Marshall et al. | | 6,567,834 B1 | 5/2003 | Marshall et al. |
| 6,256,724 B1 | 7/2001 | Hocevar et al. | | 6,571,381 B1 | 5/2003 | Vorbach et al. |
| 6,260,179 B1 | 7/2001 | Ohsawa et al. | | 6,587,939 B1 | 7/2003 | Takano |
| 6,262,908 B1 | 7/2001 | Marshall et al. | | 6,631,487 B1 | 10/2003 | Abramovici et al. |
| 6,263,430 B1 | 7/2001 | Trimberger et al. | | 6,633,181 B1 | 10/2003 | Rupp |
| 6,266,760 B1 | 7/2001 | DeHon et al. | | 6,657,457 B1 | 12/2003 | Hanrahan et al. |
| 6,279,077 B1 | 8/2001 | Nasserbakht et al. | | 6,658,564 B1 | 12/2003 | Smith et al. |
| 6,282,627 B1 | 8/2001 | Wong et al. | | 6,687,788 B2 | 2/2004 | Vorbach et al. |
| 6,282,701 B1 | 8/2001 | Wygodny et al. | | 6,697,979 B1 | 2/2004 | Vorbach et al. |
| 6,285,624 B1 | 9/2001 | Chen | | 6,704,816 B1 | 3/2004 | Burke |
| 6,286,134 B1 | 9/2001 | Click, Jr. et al. | | 6,708,325 B2 | 3/2004 | Cooke et al. |
| 6,288,566 B1 | 9/2001 | Hanrahan et al. | | 6,504,398 B1 | 4/2004 | Lien et al. |
| 6,289,440 B1 | 9/2001 | Casselman | | 6,717,436 B2 | 4/2004 | Kress et al. |
| 6,298,472 B1 | 10/2001 | Phillips et al. | | 6,721,830 B2 | 4/2004 | Vorbach et al. |
| 6,301,706 B1 | 10/2001 | Maslennikov et al. | | 6,728,871 B1 | 4/2004 | Vorbach et al. |
| 6,311,200 B1 | 10/2001 | Hanrahan et al. | | 6,754,805 B1 | 6/2004 | Juan |
| 6,311,265 B1 | 10/2001 | Beckerle et al. | | 6,757,847 B1 | 6/2004 | Farkash et al. |
| 6,321,366 B1 | 11/2001 | Tseng et al. | | 6,757,892 B1 | 6/2004 | Gokhale et al. |
| 6,321,373 B1 | 11/2001 | Ekanadham et al. | | 6,782,445 B1 | 8/2004 | Olgiati et al. |
| 6,338,106 B1 | 1/2002 | Vorbach et al. | | 6,785,826 B1 | 8/2004 | Durham et al. |
| 6,341,318 B1 | 1/2002 | Dakhil | | 6,802,206 B2 | 10/2004 | Patterson et al. |
| 6,347,346 B1 | 2/2002 | Taylor | | 6,803,787 B1 | 10/2004 | Wicker, Jr. |
| 6,349,346 B1 | 2/2002 | Hanrahan et al. | | 6,820,188 B2 | 11/2004 | Stansfield et al. |
| 6,353,841 B1 | 3/2002 | Marshall et al. | | 6,829,697 B1 | 12/2004 | Davis et al. |
| 6,362,650 B1 | 3/2002 | New et al. | | 6,847,370 B2 | 1/2005 | Baldwin et al. |
| 6,370,596 B1 | 4/2002 | Dakhil | | 6,868,476 B2 | 3/2005 | Rosenbluth et al. |
| 6,373,779 B1 | 4/2002 | Pang et al. | | 6,871,341 B1 | 3/2005 | Shyr |
| 6,374,286 B1 | 4/2002 | Gee | | 6,874,108 B1 | 3/2005 | Abramovici et al. |
| 6,378,068 B1 | 4/2002 | Foster et al. | | 6,886,092 B1 | 4/2005 | Douglass et al. |
| 6,381,624 B1 | 4/2002 | Colon-Bonet et al. | | 6,901,502 B2 | 5/2005 | Yano et al. |
| 6,389,379 B1 | 5/2002 | Lin et al. | | 6,928,523 B2 | 8/2005 | Yamada |
| 6,389,579 B1 | 5/2002 | Phillips et al. | | 6,961,924 B2 | 11/2005 | Bates et al. |
| 6,392,912 B1 | 5/2002 | Hanrahan et al. | | 6,977,649 B1 | 12/2005 | Baldwin et al. |
| 6,398,383 B1 | 6/2002 | Huang | | 7,000,161 B1 | 2/2006 | Allen et al. |
| 6,400,601 B1 | 6/2002 | Sudo et al. | | 7,007,096 B1 | 2/2006 | Lisitsa et al. |
| 6,404,224 B1 | 6/2002 | Azegami et al. | | 7,010,667 B2 | 3/2006 | Vorbach et al. |
| 6,405,299 B1 | 6/2002 | Vorbach et al. | | 7,038,952 B1 | 5/2006 | Zack et al. |
| 6,421,808 B1 | 7/2002 | McGeer et al. | | 7,210,129 B2 | 4/2007 | May et al. |
| 6,421,809 B1 | 7/2002 | Wuytack et al. | | 7,216,204 B2 | 5/2007 | Rosenbluth et al. |
| 6,421,817 B1 | 7/2002 | Mohan et al. | | 7,237,087 B2 | 6/2007 | Vorbach et al. |
| 6,425,054 B1 | 7/2002 | Nguyen | | 7,249,351 B1 | 7/2007 | Songer et al. |
| 6,425,068 B1 | 7/2002 | Vorbach | | 7,254,649 B2 | 8/2007 | Subramanian et al. |
| 6,427,156 B1 | 7/2002 | Chapman et al. | | 7,340,596 B1 | 3/2008 | Crosland et al. |
| 6,430,309 B1 | 8/2002 | Pressman et al. | | 7,350,178 B1 | 3/2008 | Crosland et al. |
| 6,434,642 B1 | 8/2002 | Camilleri et al. | | 2001/0001860 A1 | 5/2001 | Beiu |
| 6,434,695 B1 | 8/2002 | Esfahani et al. | | 2001/0010074 A1 | 7/2001 | Nishihara et al. |
| 6,434,699 B1 | 8/2002 | Jones et al. | | 2001/0018733 A1 | 8/2001 | Fujii et al. |
| 6,437,441 B1 | 8/2002 | Yamamoto | | 2001/0032305 A1 | 10/2001 | Barry |
| 6,438,747 B1 | 8/2002 | Schreiber et al. | | 2002/0013861 A1 | 1/2002 | Adiletta et al. |
| 6,457,116 B1 | 9/2002 | Mirsky et al. | | 2002/0038414 A1 | 3/2002 | Taylor |
| 6,476,634 B1 | 11/2002 | Bilski | | 2002/0045952 A1 | 4/2002 | Blemel |
| 6,477,643 B1 | 11/2002 | Vorbach et al. | | 2002/0083308 A1 | 6/2002 | Pereira et al. |
| 6,480,937 B1 | 11/2002 | Vorbach et al. | | 2002/0103839 A1 | 8/2002 | Ozawa |
| 6,480,954 B2 | 11/2002 | Trimberger et al. | | 2002/0124238 A1 | 9/2002 | Metzgen |
| 6,487,709 B1 | 11/2002 | Keller et al. | | 2002/0138716 A1 | 9/2002 | Master et al. |
| 6,490,695 B1 | 12/2002 | Zagorski et al. | | 2002/0143505 A1 | 10/2002 | Drusinsky |
| 6,496,971 B1 | 12/2002 | Lesea et al. | | 2002/0144229 A1 | 10/2002 | Hanrahan |
| 6,507,947 B1 | 1/2003 | Schreiber et al. | | 2002/0165886 A1 | 11/2002 | Lam |
| 6,513,077 B2 | 1/2003 | Vorbach et al. | | 2003/0001615 A1 | 1/2003 | Sueyoshi et al. |
| 6,516,382 B2 | 2/2003 | Manning | | 2003/0014743 A1 | 1/2003 | Cooke et al. |
| 6,518,787 B1 | 2/2003 | Allegrucci et al. | | 2003/0046607 A1 | 3/2003 | Vorbach et al. |
| 6,519,674 B1 | 2/2003 | Lam et al. | | 2003/0052711 A1 | 3/2003 | Taylor |
| 6,523,107 B1 | 2/2003 | Stansfield et al. | | 2003/0055861 A1 | 3/2003 | Lai et al. |
| 6,525,678 B1 | 2/2003 | Veenstra et al. | | 2003/0056085 A1 | 3/2003 | Vorbach |

| | | | |
|---|---|---|---|
| 2003/0056091 A1 | 3/2003 | Greenberg | |
| 2003/0056202 A1 | 3/2003 | Vorbach et al. | |
| 2003/0061542 A1 | 3/2003 | Bates et al. | |
| 2003/0062922 A1 | 4/2003 | Douglass et al. | |
| 2003/0086300 A1 | 5/2003 | Noyes et al. | |
| 2003/0093662 A1 | 5/2003 | Vorbach et al. | |
| 2003/0097513 A1 | 5/2003 | Vorbach et al. | |
| 2003/0123579 A1 | 7/2003 | Safavi et al. | |
| 2003/0135686 A1 | 7/2003 | Vorbach et al. | |
| 2003/0192032 A1 | 10/2003 | Andrade et al. | |
| 2004/0015899 A1 | 1/2004 | May et al. | |
| 2004/0025005 A1 | 2/2004 | Vorbach et al. | |
| 2004/0168099 A1 | 8/2004 | Vorbach et al. | |
| 2004/0199688 A1 | 10/2004 | Vorbach et al. | |
| 2005/0066213 A1 | 3/2005 | Vorbach et al. | |
| 2005/0144210 A1 | 6/2005 | Simkins et al. | |
| 2005/0144212 A1 | 6/2005 | Simkins et al. | |
| 2005/0144215 A1 | 6/2005 | Simkins et al. | |
| 2006/0230094 A1 | 10/2006 | Simkins et al. | |
| 2006/0230096 A1 | 10/2006 | Thendean et al. | |

FOREIGN PATENT DOCUMENTS

| | | |
|---|---|---|
| DE | 44 16 881 | 11/1994 |
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 628 917 | 12/1994 |
| EP | 0 678 985 | 10/1995 |
| EP | 0 686 915 | 12/1995 |
| EP | 0 707 269 | 4/1996 |
| EP | 0 726 532 | 8/1996 |
| EP | 0 735 685 | 10/1996 |
| EP | 0 835 685 | 10/1996 |
| EP | 0 746 106 | 12/1996 |
| EP | 0 748 051 | 12/1996 |
| EP | 0 926 594 | 6/1999 |
| EP | 1 061 439 | 12/2000 |
| EP | 1 102 675 | 5/2001 |
| EP | 1 115 204 | 7/2001 |
| EP | 1 146 432 | 10/2001 |
| EP | 0 696 001 | 12/2001 |
| EP | 1 669 885 | 6/2006 |
| FR | 2 752 466 | 2/1998 |
| GB | 2 304 438 | 3/1997 |
| JP | 58-58672 | 4/1983 |
| JP | 01-229378 | 9/1989 |
| JP | 2-130023 | 5/1990 |
| JP | 2-226423 | 9/1990 |
| JP | 5-276007 | 10/1993 |
| JP | 05-509184 | 12/1993 |
| JP | 6-266605 | 9/1994 |
| JP | 07-086921 | 3/1995 |
| JP | 7-154242 | 6/1995 |
| JP | 8-148989 | 6/1995 |
| JP | 8-44581 | 2/1996 |
| JP | 08069447 | 3/1996 |
| JP | 08-101761 | 4/1996 |
| JP | 8-102492 | 4/1996 |
| JP | 8-221164 | 8/1996 |
| JP | 8-250685 | 9/1996 |
| JP | 9-27745 | 1/1997 |
| JP | 09-294069 | 11/1997 |
| JP | 11-307725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO95/00161 | 1/1995 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | 2000/045282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/21010 | 3/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/032975 | 4/2003 |
| WO | WO03/036507 | 5/2003 |
| WO | WO 03/0981875 | 11/2003 |
| WO | WO 2004/053718 | 6/2004 |
| WO | WO2004/114128 | 12/2004 |
| WO | WO2005/045692 | 3/2005 |

OTHER PUBLICATIONS

Altera, "Flex 8000 Programmable Logic Device Family," Altera Corporation product description, Jan. 2003, pp. 1-62.
Altera, "Flex 10K Embedded Programmable Logic Device Family," Altera Corporation product description, Jan. 2003, pp. 1-128.
Atmel, 5-K-50K Gates Coprocessor FPGA with Free Ram, Data Sheet, Jul. 2006, 55 pages.

Atmel, FPGA-based FIR Filter Application Note, Sep. 1999, 10 pages.
Atmel, "An Introduction to DSP Applications using the AT40K FPGA," FPGA Application Engineering, San Jose, CA, Apr. 2004, 15 pages.
Atmel, Configurable Logic Design & Application Book, Atmel Corporation, 1995, pp. 2-19 through 2-25.
Atmel, Field Programmable Gate Array Configuration Guide, AT6000 Series Configuration Data Sheet, Sep. 1999, pp. 1-20.
Bacon, D. et al., "Compiler Transformations for High-Performance Computing," ACM Computing Surveys, 26(4):325-420 (1994).
Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003).
Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002).
Cardoso, J.M.P. et al., "Compilation and Temporal Partitioning for a Coarse-Grain Reconfigurable Architecture," Lysacht, P. & Rosential, W. eds., "New Algorithms, Architectures and Applications for Reconfigurable Computing," (2005) pp. 105-115.
Cardoso, J.M.P. et al., "Macro-Based Hardware Compilation of Java™ Bytecodes into a Dynamic Reconfigurable Computing System," Field-Programmable Custom Computing Machines (1999) FCCM '99. Proceedings. Seventh Annual IEEE Symposium on NAPA Valley, CA, USA, Apr. 21-23, 1999, IEEE Comput. Soc, US, (Apr. 21, 1999), pp. 2-11.
Clearspeed, CSX Processor Architecture, Whitepaper, PN-1110-0702, 2007, pp. 1-15, www.clearspeed.com.
Clearspeed, CSX Processor Architecture, Whitepaper, PN-1110-0306, 2006, pp. 1-14, www.clearspeed.com.
Cook, Jeffrey J., "The Amalgam Compiler Infrastructure," Thesis at the University of Illinois at Urbana-Champaign (2004) Chapter 7 & Appendix G.
Cronquist, D. et al., "Architecture Design of Reconfigurable Pipelined Datapaths," Department of Computer Science and Engineering, University of Washington, Seattle, WA, Proceedings of the $20^{th}$ Anniversary Conference on Advanced Research in VSLI, 1999, pp. 1-15.
DeHon, Andre, "Reconfigurable Architectures for General-Purpose Computing," Massachusetts Institute of Technology, Technical Report AITR-1586, Oct. 1996, XP002445054, Cambridge, MA, pp. 1-353.
Ebeling, C. et al., "Mapping Applications to the RaPiD Configurable Architecture," Department of Computer Science and Engineering, University of Washington, Seattle, WA, *FPGAs for Custom Computing Machines. 1997. Proceedings., The 5th Annual IEEE Symposium*, Publication Date: Apr. 16-18, 1997, 10 pages.
Equator, Pixels to Packets, Enabling Multi-Format High Definition Video, Equator Technologies BSP-15 Product Brief, www.equator.com, 2001, 4 pages.
Fawcett, B.K., "Map, Place and Route: The Key to High-Density PLD Implementation," Wescon Conference, IEEE Center (Nov. 7, 1995) pp. 292-297.
Freescale Slide Presentation, An Introduction to Motorola's RCF (Reconfigurable Computer Fabric) Technology, Presented by Frank David, Launched by Freescale Semiconductor, Inc., 2004, 39 pages.
Genius, D. et al., "A Case for Array Merging in Memory Hierarchies," Proceedings of the 9th International Workshop on Compilers for Parallel Computers, CPC'01 (Jun. 2001).
Hartenstein, R. et al., "A new FPGA architecture for word-oriented datapaths," Proc. FPL '94, Springer LNCS, Sep. 1994, pp. 849.
Hendrich, N., et al., "Silicon Compilation and Rapid Prototyping of Microprogrammed VLSI-Circuits with MIMOLA and SOLO 1400," Microprocessing & Microprogramming (Sep. 1992) vol. 35(1-5), pp. 287-294.
Hwang, K., "Computer Architecture and Parallel Processing," Data Flow Computers and VLSI Computations, XP-002418655, 1985 McGraw-Hill, Chapter 10, pp. 732-807.
IBM Technical Disclosure Bulletin, IBM Corp., New York, XP000424878, Bd. 36, Nr. 11, Nov. 1, 1993, pp. 335-336.

Inside DSP, "Ambric Discloses Massively Parallel Architecture," Aug. 23, 2006, HTTP://insidedsp.com/tabid/64/articleType/ArticleView/articleId/155/Defa . . . , 2 pages.
Intel, Intel MXP5800/MXP5400 Digital Media Processors, Architecture Overview, Jun. 2004, Revision 2.4, pp. 1-14.
Kean, T.A., "Configurable Logic: A Dynamically Programmable Cellular Architecture and its VLSI Implementation," University of Edinburgh (Dissertation) 1988, pp. 1-286.
Kean, T., et al., "A Fast Constant Coefficient Multiplier for the XC6200," Xilinx, Inc., Lecture Notes in Computer Science, vol. 1142, Proceedings of the $6^{th}$ International Workshop of Field-Programmable Logic, 1996, 7 pages.
Kim et al., "A Reconfigurable Multifunction Computing Cache Architecture," IEEE Transactions on Very Large Scale Integration (VLSI) Systems vol. 9, Issue 4, Aug. 2001 pp. 509-523.
Koch, Andreas et al., "High-Level-Language Compilation for Reconfigurable Computers," Proceedings of European Workshop on Reconfigurable Communication-Centric SOCS (Jun. 2005) pages.
Larsen, S. et al., "Increasing and Detecting Memory Address Congruence," Proceedings of the 2002 IEEE International Conference on Parallel Architectures and Compilation Techniques (PACT'02), pp. 18-29 (Sep. 2002).
Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).
Mei, Bingfeng, et al., "Design and Optimization of Dynamically Reconfigurable Embedded Systems," IMEC vzw, 2003, Belgium, 7 pages, http://www.imec.be/reconfigurable/pdf/ICERSA_01_design.pdf.
Miyamori, T. et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25,1998, Monterey, California, United States, pp. 1-12.
Moraes, F., et al., "A Physical Synthesis Design Flow based on Virtual Components," XV Conference on Design of Circuits and Integrated Systems (Nov. 2000) 6 pages.
Muchnick, S., "Advanced Compiler Design and Implementation" (Morgan Kaufmann 1997), Table of Contents, 11 pages.
Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.
Nageldinger, U., "Design-Space Exploration for Coarse Grained Reconfigurable Architectures," (Dissertation) Universitaet Kaiserslautern, 2000, Chapter 2, pp. 19-45.
Neumann, T., et al., "A Generic Library for Adaptive Computing Environments," Field Programmable Logic and Applications, $11^{th}$ International Conference, FPL 2001, Proceedings (Lecture Notes in Computer Science, vol. 2147) (2001) pp. 503-512.
Olukotun, K., "The Case for a Single-Chip Microprocessor," ACM Sigplan Notices, ACM, Association for Computing Machinery, New York, vol. 31, No. 9, Sep. 1996 pp. 2-11.
Parhami, B., "Parallel Counters for Signed Binary Signals," Signals, Systems and Computers, 1989, Twenty-Third Asilomar Conference, vol. 1, pp. 513-516.
Saleeba, Z.M.G., "A Self-Reconfiguring Computer System," Department of Computer Science, Monash University (Dissertation) 1998, pp. 1-306.
Schmidt, H. et al., "Behavioral synthesis for FGPA-based computing," Carnegie Mellon University, Pittsburgh, PA, 1994 IEEE, pp. 125-132.
Schönfeld, M., et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology, (Oct. 1, 1995) vol. 11(1/2), pp. 51-74.
Shin, D., et al., "C-based Interactive RTL Design Methodology," Technical Report CECS-03-42 (Dec. 2003) pp. 1-16.
Singh, H. et al., "MorphoSys: An Integrated Reconfigurable System for Data-Parallel Computation-Intensive Applications," University of California, Irvine, CA. and Federal University of Rio de Janiero, Brazil, 2000, IEEE Transactions on Computers, pp. 1-35.

Sondervan, J., "Retiming and logic synthesis," Electronic Engineering (Jan. 1993) vol. 65(793), pp. 33, 35-36.

Soni, M., "VLSI Implementation of a Wormhole Run-time Reconfigurable Processor," Jun. 2001, (Masters Thesis)Virginia Polytechnic Institute and State University, 88 pages.

Vasell et al., "The Function Processor: A Data-Driven Processor Array for Irregular Computations," Chalmers University of Technology, Sweden, pp. 1-21.

Waingold, E., et al., "Baring it all to software: Raw machines," IEEE Computer, Sep. 1997, at 86-93.

Weinhardt, Markus et al., "Memory Access Optimization for Reconfigurable Systems," IEEE Proceedings Computers and Digital Techniques, 48(3) (May 2001).

Wolfe, M. et al., "High Performance Compilers for Parallel Computing" (Addison-Wesley 1996).

Xilinx, "XC6200 Field Programmable Gate Arrays," Apr. 24, 1997, Xilinx product description, pp. 1-73.

Xilinx, "XC3000 Series Field Programmable Gate Arrays," Nov. 6, 1998, Xilinx product description, pp. 1-76.

Xilinx, "XC4000E and XC4000X Series Field Programmable Gate Arrays," May 14, 1999, Xilinx product description, pp. 1-68.

Xilinx, "Virtex-E 1.8 V Extended Memory Field Programmable Gate Arrays," Jul. 17, 2002, Xilinx Production Product Specification, pp. 1-118.

Xilinx, "Virtex-II and Virtex-II Pro X FPGA User Guide," Mar. 28, 2007, Xilinx user guide, pp. 1-559.

Zima, H. et al., "Supercompilers for parallel and vector computers" (Addison-Wesley 1991), Table of Contents, 5 pages.

U.S. Appl. No. 60/109,417, filed Nov. 18, 1998, Jefferson et al.

Becker et al., "Automatic Parellelism Exploitation for FPL-Based Accelerators," 1998, Proc. 31$^{st}$ Annual Hawaii International Conference on System Sciences, pp. 169-178.

PACT Corporation, "The XPP Communication System," Technical Report 15 (2000), pp. 1-16.

Ohmsha, "Information Processing Handbook," edited by the Information Processing Society of Japan, pp. 376, Dec. 21, 1998.

Abnous, A., et al., "The Pleiades Architecture," Chapter 1 of *The Application of Programmable DSPs in Mobile Communications*, A. Gatherer and A. Auslander, Ed., Wiley, 2002, pp. 1-33.

Abnous, A. et al., "Ultra-Low-Power Domain-Specific Multimedia Processors," U.C. Berkeley, 1996 IEEE, pp. 461-470.

Ade, et al., "Minimum Memory Buffers in DSP Applications," Electronics Letters, vol. 30, No. 6, Mar. 17, 1994, pp. 469-471.

Albaharna, O.T. et al., "On the Viability of FPGA-Based Integrated Coprocessors," Dept. of Electrical and Electronic Engineering, Imperial College of Science, London, 1999 IEEE, pp. 206-215.

Alippi, et al., "Determining the Optimum Extended Instruction Set Architecture for Application Specific Reconfigurable VLIW CPUs," IEEE, 2001, pp. 50-56.

Arabi, et al., "PLD Integrates Dedicated High-speed Data Buffering, Complex State machine, and Fast Decode Array," conference record on WESCON '93, Sep. 28, 1993, pp. 432-436.

Athanas, "A Functional Reconfigurable Architecture and Compiler for Adoptive Computing," IEEE 1993, pp. 49-55.

Athanas, et al., "An Adaptive Hardware Machine Architecture and Compiler for Dynamic Processor Reconfigutation," IEEE, Laboratory for Engineering man/Machine Systems Division of Engineering, Box D, Brown University, Providence, Rhode Island, 1991, pp. 397-400.

Athanas et al., "Processor Reconfiguration Through Instruction-Set Metamorphosis," 1993, IEEE Computers, pp. 11-18.

Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.

Baumgarte, V. et al., PACT XPP "A Self-reconfigurable Data Processing Architecture," PACT Info. GMBH, Munchen Germany, 2001, 7 pages.

Beck et al., "From control flow to data flow," TR 89-1050, Oct. 1989, Dept. of Computer Science, Cornell University, Ithaca, NY, pp. 1-25.

Becker, J. et al., "Parallelization in Co-compilation for Configurable Accelerators—a Host/accelerator Partitioning Compilation Method," Poceedings of Asia and South Pacific Design Automation Conference, Yokohama, Japan, Feb. 10-13, 1998, 11 pages.

Bittner, "Wormhole Run-time Reconfiguration: Conceptualization and VLSI Design of a High Performance Computing System," *Dissertation*, Jan. 23, 1997, pp. I-XX, 1-415.

Bratt, A, "Motorola field programmable analogue arrays, present hardware and future trends," Motorola Programmable Technology Centre, Gadbrook Business Centre, Northwich, Cheshires, 1998, The Institute of Electrical Engineers, IEE. Savoy Place, London, pp. 1-5.

Cadambi, et al., "Managing Pipeline-reconfigurable FPGAs," ACM, 1998, pp. 55-64.

Callahan, et al., "The Garp Architecture and C Compiler," Computer, Apr. 2000, pp. 62-69.

Cardoso, J.M.P. et al., "A novel algorithm combining temporal partitioning and sharing of functional units," University of Algarve, Faro, Portugal, 2001 IEEE, pp. 1-10.

Cardoso, Joao M.P. and Markus Weinhardt, "XPP-VC: A C Compiler with Temporal Partitioning for the PACT-XPP Arhcitecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874.

Cardoso, J.M.P. " Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 (Table of Contents and English Abstract only).

Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.

Compton, K. et al., "Configurable Computing: A Survey of Systems and Software," Northwestern University, Dept. of ECE, Technical Report, 1999, (XP-002315148), 39 pages.

DeHon, A., "DPGA Utilization and Application," MIT Artificial Intelligence Laboratory, Proceedings of the Fourth International ACM Symposium on Field-Programmable Gate Arrays (FPGA '96), IEEE Computer Society, pp. 1-7.

Diniz, P., et al., "A behavioral synthesis estimation interface for configurable computing," University of Southern California, Marina Del Rey, CA, 2001 IEEE, pp. 1-2.

Diniz, P., et al., "Automatic Synthesis of Data Storage and Control Structures for FPGA-based Computing Engines," 2000, IEEE, pp. 91-100.

Donandt, "Improving Response Time of Programmable Logic Controllers by use of a Boolean Coprocessor," AEG Research Institute Berlin, IEEE, 1989, pp. 4-167-4-169.

Dutt, et al., "If Software is King for Systems-in-Silicon, What's New in Compiler?," IEEE, 1997, pp. 322-325.

Ferrante, J. et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.

Fineberg, S, et al., "Experimental Analysis of a Mixed-Mode Parallel Architecture Using Bitonic Sequence Sorting," Journal of Parallel and Distributed Computing, vol. 11, No. 3, Mar. 1991, pp. 239-251.

Fornaciari, et al., System-level power evaluation metrics, 1997 Proceedings of the 2$^{nd}$ Annual IEEE International Conference on Innovative Systems in Silicon, New York, NY, Oct. 1997, pp. 323-330.

Forstner, "Wer Zuerst Kommt, Mahlt Zuerst!: Teil 3: Einsatzgebiete und Anwendungbeispiele von FIFO-Speichern," Elektronik, Aug. 2000, pp. 104-109.

Franklin, Manoj et al., "A Fill-Unit Approach to Multiple Instruction Issue," Proceedings of the Annual International Symposium on Microarchitecture, Nov. 1994, pp. 162-171.

Gokhale, M.B.et al., "Automatic Allocation of Arrays to Memories in FPGA processors with Multiple Memory Banks," Field-Programmable Custom Computing Machines, 1999, IEEE, pp. 63-67.

Hammes, Jeff et al., "Camcron: High Level Language Compilation for Reconfigurable Systems," Department of Computer Science, Colorado State University, Conference on Parallel Architectures and Compilation Techniques, Oct. 12-16, 1999, 9 pages.

Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.

Hastie et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).

Hauck, "The Roles of FPGAs in Reprogrammable Systems," IEEE, Apr. 1998, pp. 615-638.

Hauser, J.R., et al., "Garp: A MIPS Processor with a Reconfigurable Coprocessor," University of California, Berkeley, IEEE, 1997, pp. 24-33.

Hedge, S.J., "3D WASP Devices for On-line Signal and Data Processing," 1994, International Conference on Wafer Scale Integration, pp. 11-21.

Hwang, K., "Advanced Compute Architecture—Parallelism, Scalability, Programmability," 1993, McGraw-Hill, Inc., pp. 348-355.

Hwang, L. et al., "Min-cut Replication in Partitioned Networks," IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.

Iseli, C.,et al. "A C++ Compiler for FPGA Custom Execution Units Synthesis," IEEE, 1995, pp. 173-179.

Isshiki, Tsuyoshi, et al., "Bit-Serial Pipeline Synthesis for Multi-FPGA Systems with C++ Design Capture," 1996 IEEE, pp. 38-47.

Jacob, J., et al., "Memory Interfacing and Instruction Specification for Reconfigurable Processors," ACM 1999, pp. 145-154.

Jantsch, Axel et al., "A Case Study on Hardware/Software Partitioning," Royal Institute of Technology, Kista, Sweden, Apr. 10, 1994, IEEE, pp. 111-118.

John, L., et al., "A Dynamically Reconfigurable Interconnect for Array Processors," vol. 6, NO. 1, Mar. 1998, IEEE, pp. 150-157.

Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.

Kaul, M., et al., "An automated temporal partitioning and loop fission approach of FPGA based reconfigurable synthesis of DSP applications," University of Cincinnati, Cincinnati, OH, ACM 1999, pp. 616-622.

Knittel, Gunter, "A PCI-compatible FPGA-Coprocessor for 2D/3D Image Processing," University of Turgingen, Germany, 1996 IEEE, pp. 136-145.

Koch, A., et al., "Practical Experiences with the SPARXIL Co-Processor," 1998, IEEE, pp. 394-398.

Koren et al., "A data-driven VLSI array for arbitrary algorithms," IEEE Computer Society, Long Beach, CA vol. 21, No. 10, Oct. 1, 1988, pp. 30-34.

Kung, "Deadlock Avoidance for Systolic Communication," 1988 Conference Proceedings of the 15th Annual International Symposium on Computer Architecture, May 30, 1998, pp. 252-260.

Lee et al., "A new distribution network based on controlled switching elements and its applications," IEEE/ACT Trans. of Networking, vol. 3, No. 1, pp. 70-81, Feb. 1995.

Lee, Jong-eun et al., "Reconfigurable ALU Array Architecture with Conditional Execution," International Soc. Design Conference (ISOOC) [online] Oct. 25, 2004, Seoul, Korea, 5 pages.

Ling, X., "WASMII: An MPLD with Data-Driven Control on a Virtual Hardware" Journal of Supercomputing, Kluwer Acdemic Publishers, Dordrecht, Netherlands, 1995, pp. 253-276.

Ling et al., "WASMII: A Multifunction Programmable Logic Device (MPLD) with Data Driven Control," The Transactions of the Institute of Electronics, Information and Communication Engineers, Apr. 25, 1994, vol. J77-D-1, Nr. 4, pp. 309-317. [This references is in Chinese, but should be comparable in content to the Ling et al. reference above].

Mano, M.M., "Digital Design," by Prentice Hall, Inc., Englewood Cliffs, New Jersey 07632, 1984, pp. 119-125, 154-161.

Margolus, N., "An FPGA architecture for DRAM-based systolic computations," Boston University Center for Computational Science and MIT Artificial Intelligence Laboratory, IEEE 1997, pp. 2-11.

Maxfield,C., "Logic that Mutates While-U-Wait," EDN (Bur. Ed) (USA), EDN (European Edition), Nov. 7, 1996, Cahners Publishing, USA, pp. 137-140, 142.

Miller, M.J., et al., "High-Speed FIFOs Contend with Widely Differing Data Rates: Dual-port RAM Buffer and Dual-pointer System Provide Rapid, High-density Data Storage and Reduce Overhead," Computer Design, Sep. 1, 1985, pp. 83-86.

Mirsky, E. DeHon, "MATRIX: A Reconfigurable Computing Architecture with Configurable Instruction Distribution and Deployable Resource," Proceedings of the IEEE Symposium on FPGAs for Custom Computing Machines, 1996, pp. 157-166.

Myers, G. "Advances in Computer Architecture," Wiley-Interscience Publication, 2nd ed., John Wiley & Sons, Inc., 1978, pp. 463-494.

Nilsson, et al., "The Scalable Tree Protocol—A Cache Coherence Approaches for Large-Scale Multiprocessors," IEEE, pp. 498-506, Dec. 1992.

Norman, R.S., "Hyperchip Business Summary, The Opportunity," Jan. 31, 2000, pp. 1-3.

Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.

Piotrowski, A., "IEC-BUS, Die Funktionsweuse des IEC-Bus unde seine Anwendung in Geräten und Systemen," 1987, Franzis-Verlag GmbH, München, pp. 20-25.

Quenot, G.M., et al., "A Reconfigurable Compute Engine for Real-Time Vision Automata Prototyping," Laboratoire Systeme de Perception, DGA/Etablissment Technique Central de l'Armement, France, 1994 IEEE, pp. 91-100.

Razdan et al., A High-Performance Microarchitecture with Hardware-Programmable Functional Units, Micro-27, Proceedings of the 27th Annual International Symposium on Microarchitecture, IEEE Computer Society and Association for Computing Machinery, Nov. 30-Dec. 2, 1994, pp. 172-180.

Saleeba, M. "A Self-Contained Dynamically Reconfigurable Processor Architecture," Sixteenth Australian Computer Science Conference, ASCS-16, QLD, Australia, Feb. 1993, pp. 59-70.

Schmidt, H. et al., "Behavioral synthesis for FPGA-based computing," Carnegie Mellon University, Pittsburgh, PA, 1994 IEEE, pp. 125-132.

Schmit, et al., Hidden Markov Modeling and Fuzzy Controllers in FPGAs, FPGAs for Custom Computing machines, 1995; Proceedings, IEEE Symposium in Napa Valley, CA, Apr. 1995, pp. 214-221.

Shirazi, et al., "Quantitative analysis of floating point arithmetic on FPGA based custom computing machines," IEEE Symposium on FPGAs for Custom Computing Machines, IEEE Computer Society Press, Apr. 19-21, 1995, pp. 155-162.

Siemers, C., "Rechenfabrik Ansaetze Fuer Extrem Parallele Prozessoren," Verlag Heinze Heise GmbH., Hannover, DE No. 15, Jul. 16, 2001, pp. 170-179.

Siemers et al., "The .>S<puter: A Novel Microarchitecture Mode for Execution inside Superscalar and VLIW Processors Using Reconfigurable Hardware," Australian Computer Science Communications, vol. 20, No. 4, Computer Architecture, Proceedings of the 3rd Australian Computer Architecture Conference, Perth, John Morris, Ed., Feb. 2-3, 1998, pp. 169-178.

Simunic, et al., Source Code Optimization and Profiling of Energy Consumation in Embedded Systems, Proceedings of the 13th International Symposium on System Synthesis, Sep. 2000, pp. 193-198.

Skokan, Z.E., "Programmable logic machine (A programmable cell array)," IEEE Journal of Solid-State Circutis, vol. 18, Issue 5, Oct. 1983, pp. 572-578.

Sueyoshi, T, "Present Status and Problems of the Reconfigurable Computing Systems Toward the Computer Evolution," Department of Artificial Intelligence, Kyushi Institue of Technology, Fukuoka, Japan; Institute of Electronics, Information and Communication Engineers, vol. 96, No. 426, IEICE Technical Report (1996), pp. 111-119 [English Abstract Only].

Sutton et al., "A Multiprocessor DSP System Using PADDI-2," U.C. Berkeley, 1998 ACM, pp. 62-65.

Tau, E., et al., "A First Generation DPGA Implementation," *FPD'95*, pp. 138-143.

Tenca, A.F., et al., "A Variable Long-Precision Arithmetic Unit Design for Reconfigurable Coprocessor Architectures," University of California, Los Angeles, 1998, pp. 216-225.

The XPP White Paper, Release 2.1, PACT—A Technical Perspective, Mar. 27, 2002, pp. 1-27.

TMS320C54X DSP: CPU and Peripherals, Texas Instruments, 1996, 25 pages.

TMS320C54x DSP: Mnemonic Instruction Set, Texas Instruments, 1996, 342 pages.

Tsutsui, A., et al., "Yards: FPGA/MOU Hybrid Architecture for Telecommunication Data Processing," NTT Optical Network Systems Laboratories, Japan, 1997 ACM, pp. 93-99.

Villasenor, et al., "Configurable Computing Solutions for Automatic Target Recognition," IEEE, 1996 pp. 70-79.

Villasenor, et al., "Configurable Computing," *Scientific American*, vol. 276, No. 6, Jun. 1997, pp. 66-71.

Villasenor, et al., "Express Letters Video Communications Using Rapidly Reconfigurable Hardware," IEEE Transactions on Circuits and Systems for Video Technology, IEEE, Inc., NY, Dec. 1995, pp. 565-567.

Wada, et al., "A Performance Evaluation of Tree-based Coherent Distributed Shared Memory," Proceedings of the Pacific RIM Conference on Communications, Comput and Signal Processing, Victoria, May 19-21, 1993, pp. 390-393.

Weinhardt, M., "Compilation Methods for Structure-programmable Computers," dissertation, ISBN 3-89722-011-3, 1997.

Weinhardt, M., "Compilation Methods for Structure-programmable Computers," dissertation, ISBN 3-89722-011-3, 1997. [Table of Contents and English Abstract Provided].

Weinhardt, Markus et al., "Pipeline Vectorization for Reconfigurable Systems," 1999, IEEE, pp. 52-62.

Weinhardt, Markus et al., "Pipeline Vectorization," IEEE Transactions on Computer-Aided Design of Integrated Circuits and Systems, vol. 20, No. 2, Feb. 2001, pp. 234-248.

Wittig, et al., "OneChip: An FPGA Processor with Reconfigurable Logic," IEEE, 1996, pp. 126-135.

Wu, et al., "A New Cache Directory Scheme," IEEE, pp. 466-472, Jun. 1996.

Xu, H.Y. et al., "Parallel QR Factorization on a Blovk Data Flow Architecture," Conference Proceeding Article, Mar. 1, 1992, pp. 332-336 XPO10255276, p. 333, Abstract 2.2, 2.3, 2.4—p. 334.

Xilinx, "Logic Cell Array Families: XC4000, XC4000A and XC4000H," product description, pp. 2-7, 2-9, 2-14, 2-15, 8-16, and 9-14.

Xilinx, "Spartan and SpartanXL Families Field Programmable Gate Arrays," Jan. 1999, Xilinx, pp. 4-3 through 4-70.

Ye, Z.A. et al., "A C-Computer for a Processor With a Reconfigurable Functional Unit," FPGA 2000 ACM/SIGNA International Symposium on Field Programmable Gate Arrays, Monterery, CA Feb. 9-11, 2000, pp. 95-100.

Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.

Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993.

Zhang, et al., Architectural Evaluation of Flexible Digital Signal Processing for Wireless Receivers, Signal, Systems and Computers, 2000; Conference Record of the Thirty-Fourth Asilomar Conference, Bd. 1, Oct. 29, 2000, pp. 78-83.

Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.

Zhang, et al., "Abstract: Low-Power Heterogeneous Reconfigurable Digital Signal Processors with Energy-Efficient Interconnect Network," U.C. Berkeley, pp. 1-120.

Asari, et al., "FeRAM circuit technology for system on a chip," *Proceedings First NASA/DoD Workshop on Evolbable Hardware*, pp. 193-197 (1999).

Lee, et al., "Multimedia extensions for general-purpose processors," *IEEE Workshop on Signal Processing Systems, SIPS 97—Design and Implementation*, pp. 9-23 (1997).

Pirsch, et al., "VLSI implementation of image and video multimedia processing systems," *IEEE Transactions on Circuits and Systems for Video Technology* 8(7): 878-891 (Nov. 1998).

Salefski, et al., "Re-configurable computing in wireless," *Annual ACM IEEE Design Automation Conference: Proceedings of the 38th conference on Design automation*, pp. 178-183 (2001).

Schmidt, et al., "Datawave: A Single-Chip Multiprocessor for Video Applications," *IEEE Micro* 11(3): 22-25 and 88-94 (Jun. 1991).

Advanced RISC Machines, "Introduction to AMBA," Section 1, pp. 1-1 to 1-7 (Oct. 1996).

Arm, "The Architecture for the Digital World," http://www.arm.com/products, 3 pages (Mar. 18, 2009).

Arm, "The Architecture for the Digital World; Milestones," http://www.arm.com/aboutarm/milestones.html, 5 pages (Mar. 18, 2009).

Del Corso, et al., "Microcomputer Buses and Links," Academic Press Inc. Ltd., pp. 138-143, 277-285 (1986).

"IEEE Standard Test Access Port and Boundary-Scan Architecture," IEEE Std. 1149.1-1990, pp. 1-127 (1993).

PCI Local Bus Specificatino, Production Version, Revision 2.1, Portland, OR, pp. 1-281 (Jun. 1, 1995).

"The Programmable Logic Data Book," XILINX, Inc., Section 2, pp. 1-240, Section 8, pp. 1, 23-25, 29, 45-52, 169-172 (1994).

Mei, Bingfeng et al., "Adres: An Architecture with Tightly Coupled VLIW Processor and Coarse-Grained Reconfigurable Matrix," Proc. *Field-Programming Logic and Applications* (FPL 03), Springer, 2003, pp. 61-70.

\* cited by examiner

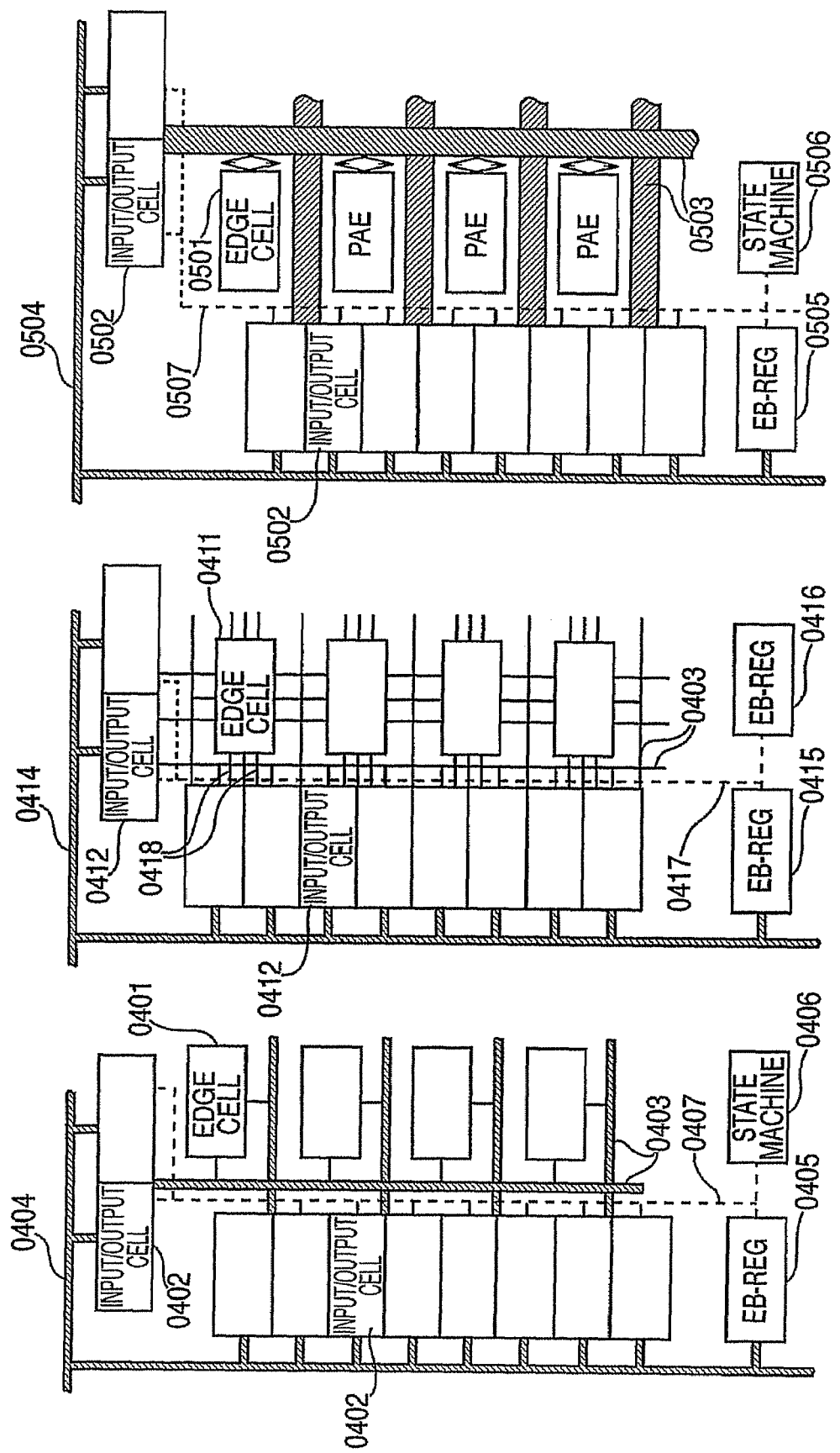

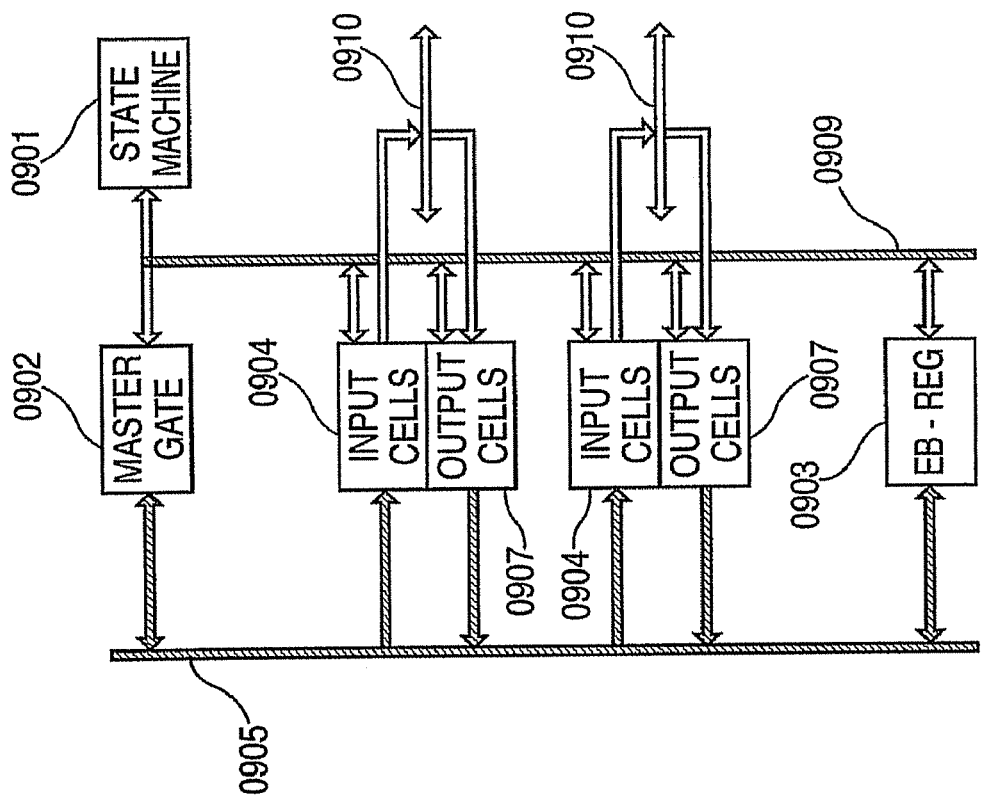
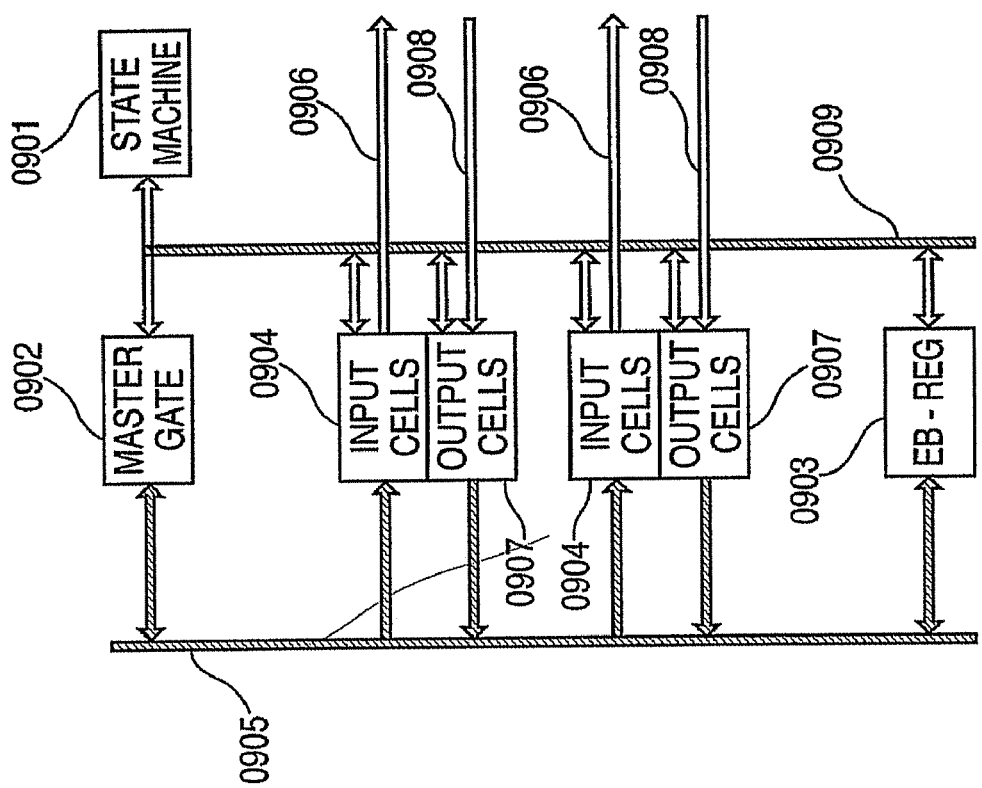
FIG. 9a
FIG. 9b

I/O AND MEMORY BUS SYSTEM FOR DFPS AND UNITS WITH TWO- OR MULTI-DIMENSIONAL PROGRAMMABLE CELL ARCHITECTURES

CROSS-REFERENCES TO RELATED APPLICATIONS

This application is a continuation of U.S. patent application Ser. No. 10/792,168 filed on Mar. 2, 2004, now U.S. Pat. No. 7,243,175 which is a continuation of U.S. patent application Ser. No. 10/304,252 filed on Nov. 26, 2002, now U.S. Pat. No. 6,721,830 which is a continuation of U.S. patent application Ser. No. 09/915,213 filed on Jul. 25, 2001, now U.S. Pat. No. 6,513,077 which is a continuation of U.S. patent application Ser. No. 09/335,974 filed Jun. 18, 1999, now U.S. Pat No. 6,338,106 which is a continuation of International Patent Application PCT/DE97/03013 filed on Dec. 21, 1997 and a continuation-in-part of U.S. patent application Ser. No. 08/947,254 filed on Oct. 8, 1997, now U.S. Pat. No. 6,119,181 the entire contents of each of which are expressly incorporated herein by reference thereto.

BACKGROUND INFORMATION

DFP-Based Systems:

German Patent No. DE 44 16 881 describes data flow processors (DFPs) in which lines of each edge cell, i.e., a cell at the edge of a cell array often in direct contact with the terminals of the unit, lead outward via the terminals of the unit. The lines do not have any specific function. Instead, the lines assume the function that is written into the edge cells. Several DFPs may be interconnected to form a matrix by connecting all terminals.

Systems with Two- or Multi-Dimensional Programmable Cell Architectures:

In systems with two- or multi-dimensional programmable cell architectures, such as field programmable gate arrays (FPGAs) and dynamically programmable gate arrays (DPGAs), a certain subset of internal bus systems and lines of the edge cells are connected to the outside via the unit terminals. The lines do not have any specific function, and instead they assume the function written in the edge cells. If several FPGAs/DPGAs are interconnected, the terminals assume the function implemented in the hardware or software.

Problems

DFP-Based Systems:

The wiring complexity for peripherals or for interconnecting DFPs is very high, because the programmer must also ensure that the respective functions are integrated into the cells of the DFP(s). For connecting a memory, a memory management unit must be integrated into the unit. For connecting peripherals, the peripherals must be supported. Additionally, cascading of DFPs must be similarly taken into account. This is relatively complicated. Moreover, space in the unit is lost for the respective implementations.

Systems with two- or multi-dimensional programmable cell architectures (FPGAs, DPGAs): The above also applies to FPGAs and DPGAs, in particular when the FPGAs and DPGAs implement algorithms or operate as arithmetic (co) processors.

SUMMARY

In accordance with an example embodiment of the present invention, the expense of wiring, in particular the number of unit terminals required, is greatly reduced. A uniform bus system operates without any special consideration by a programmer. A permanent implementation of the bus system control is provided. Memory and peripherals can be connected to the bus system without any special measures. Likewise, units can be cascaded with the help of the bus system.

According to the present invention, a general bus system is provided which combines a number of internal lines and leads them as a bundle to the terminals. The bus system control is predefined and does not require any influence by the programmer. Any number of memory devices, peripherals or other units (i.e., cascading) can be connected to the bus system.

BRIEF DESCRIPTION OF THE DRAWINGS

FIG. 4 shows an example of line bundling in FPGAs according to an example embodiment of the present invention.
FIG. 5 shows an example of line bundling in DFPs according to an example embodiment of the present invention.
FIG. 9 shows an example of a complete bus system with controller according to an example embodiment of the present invention.

DETAILED DESCRIPTION

Figure 1:
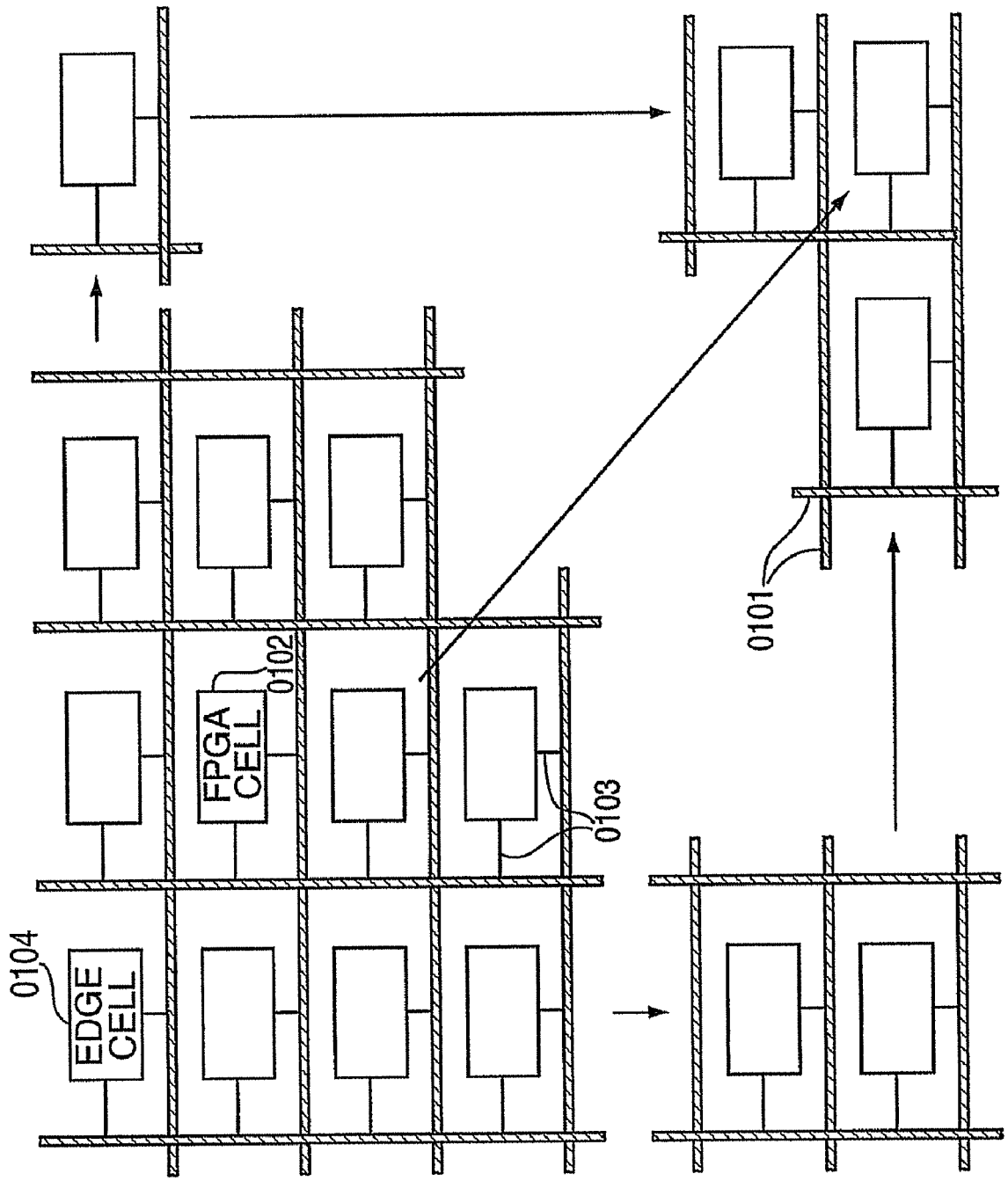
FIG. 1 shows an example of a basic unit as a type A FPGA.

The following description encompasses several architectures which are controlled and configured by a primary logic unit, such as DFPs, FPGAs, DPGAs, etc. Parts of the primary logic unit may be integrated on the unit. Alternatively, the architectures may be dynamically controlled or reconfigured directly through the unit itself (see, e.g., FIGS. 6, 7). The architectures may be implemented in a permanent form on the unit, or they may be created by configuring and possibly combining multiple logic cells, i.e., configurable cells which fulfill simple logical or arithmetic functions according to their configuration (cf. DFP, FPGA, DPGA).

Bundling Internal Lines:

In accordance with the example embodiment of the present invention, to obtain appropriate bus architectures, a plurality of internal lines are combined in buses (I-BUSn, where n denotes the number of the bus). The lines may be internal bus systems or lines of the edge cells. For write access to the external bus (E-Bus) over clocked latches or registers (I-GATE-REG), the individual buses are connected to gates that function as switches to the E-BUS. Such a unit is called an OUTPUT CELL. Access to the E-BUS takes place in such a way that the individual latches are switched via the gates to the common E-BUS. There is always only one gate open. Each I-BUSn has a unique identification number (n: e.g., I-BUS1, I-BUS976, etc.).

For read access, the incoming E-BUS is stored temporarily in clocked latches or registers (E-GATE-REG) and then distributed over the gates to the I-BUSn. Such a unit is called an INPUT CELL. Pick up from the E-BUS takes place in such a way that an E-BUS transfer is written into one or more E-GATE-REGs. The E-GATE-REGs can then be switched either individually or together to their internal bus systems.

Read-write access can take place in any order. Under some circumstances, the internal buses I-BUSn may be subdivided into two groups, e.g., writing output buses IO-BUSn and reading input buses II-BUSn.

Address Generation:

For most accesses to external units, addresses are generated for selecting a unit or parts of a unit. The addresses may be permanent, i.e., they do not change (this is the case especially with peripheral addresses) or the addresses may change by (usually) fixed values with each access (this is the case especially with memory addresses). For generating the addresses, there are programmable counters for read access and programmable counters for write access. The counters are set at a base value by the PLU, which is the unit that configures the configurable units (DFPs, FPGAs, DPGAs, etc.) based on cell architecture. With each access to the gate, the counter is incremented or decremented by a value defined by the PLU, depending on the setting. Likewise, each counter can also be used as a register, which means that counting is not performed with each access, and the value set in the counter is unchanged. The value of the counter belonging to the gate is assigned as an address to each bus transfer. The counter is set by a setting register (MODE PLUREG) to which the PLU has write access.

Masks and States:

Each gate is assigned a number of bits in MODE PLUREG (described below). The bits indicate whether the gate is active or is skipped by the controller, i.e., is masked out (MASK). If a gate is masked out, the gate is skipped in running through all gates to connect to the respective bus system.

The following mask records are examples of possible mask records:
  always skip the INPUT/OUTPUT CELL,
  skip the INPUT/OUTPUT CELL only in writing,
  skip the INPUT/OUTPUT CELL only in reading if the E-BUS MASTER has not accessed the INPUT/OUTPUT CELL,
  never skip the INPUT/OUTPUT CELL.

Each gate is assigned a state register which may be designed as an RS flip-flop. This register indicates whether data have been written into the register belonging to the gate.

Mode Plureg

The MODE PLUREG can be written and read by the PLU. It serves to set the bus system.

One possible MODE PLUREG architecture from the standpoint of PLU is set forth below:

| Bit 1-m | Bit k-1 | Bit 2-k | Bit 1 | Bit 0 |
|---|---|---|---|---|
| Mask | Predefined value | Step length | 0 = additive counting 1 = subtractive counting | 0 = register 1 = counter |
| Masking | | | Settings for address generator | |

Description of the INPUT CELL:

A distinction is made according to whether data is transmitted from the E-BUS to the unit (the component used for this is called the INPUT CELL) or whether data is transmitted from the unit to the E-BUS (the component used for this is called an OUTPUT CELL).

An example embodiment of the INPUT CELL is as follows. A latch (I-GATE-REG) which is controlled either by the external E-BUS MASTER or the internal state machine serves as a buffer for the data received from the E-BUS. The clock pulse of the latch is sent to (for example) an RS flip-flop (SET-REG) which retains access to the I-GATE-REG. Downstream from the I-GATE-REG is a gate (I-GATE) which is controlled by the state machine. The data goes from the I-GATE-REG to the I(I)-BUSn via the I-GATE.

In addition the example embodiment, there is a programmable incrementer/decrementer in the INPUT CELL. The programmable incrementer/decrementer can be controlled by the state machine after each active read access to the E-BUS to increment or decrement an adjustable value. It can also serve as a simple register. This counter generates the addresses for bus access where the unit is E-BUS MASTER. The addresses are sent to the E-BUS via a gate (ADR-GATE). The ADR-REG is controlled by the state machine.

The E-BUS MASTER can poll the state of the SET-REG via another gate (STATE-GATE). Each INPUT CELL has a MODE PLUREG in which the PLU configures the counter and turns the INPUT CELL on or off (masks it).

Description of the OUTPUT CELL:

An example embodiment of an OUTPUT CELL is as follows. A latch (E-GATE-REG) which is controlled by the internal state machine provides buffer storage for the data obtained from the I-BUS.

In addition, a programmable incrementer/decrementer is provided in the OUTPUT CELL. The clock signal of the latch is sent to (for example) an RS flip-flop (SET-REG) which retains access to the E-GATE-REG. The programmable incrementer/decrementer can be controlled by the state machine after each read access to the E-BUS to increment or decrement an selectable value. It can also function as a simple register. This counter generates the addresses for bus access in which the unit is E-BUS MASTER.

The data of the E-GATE-REG, the addresses and the state of the SET-REG are sent to the E-BUS via a gate (E-GATE) which is controlled either by the external E-BUS MASTER or the internal state machine. Each OUTPUT CELL has a MODE PLUREG in which the PLU configures the counter and turns the OUTPUT CELL on and off (masks it).

Controlling the Bus System:

At a higher level than the individual gates, address generators and masks, in the example embodiment of the present invention, there is a controller consisting of a simple, conventional state machine. Two operating modes are differentiated:
1. An active mode in which the state machine controls the internal bus (I-BUS) and the external bus (E-BUS). This mode is called E-BUS MASTER because the state machine has control of the E-BUS.
2. A passive mode in which the state machine controls only the internal bus (I-BUS). The E-BUS is controlled by another external unit. The state machine reacts in this mode to the requirements of the external E-BUS MASTER. This mode of operation is called E-BUS SLAVE.

The controller manages the E-BUS protocol. The sequence differs according to whether the controller is functioning in E-BUS MASTER or E-BUS SLAVE mode. A particular protocol is not described herein, because any one of a number of conventional protocols may be implemented.

E-BUS MASTER and E-BUS SLAVE, EB-REG:

In the example embodiment, the E-BUS control register (EB-REG) is provided to manage the data traffic on the E-BUS. The E-BUS control register is connected in series with the gates and can be addressed and operated from the E-BUS. The data exchange may be regulated through the following records:

I-WRITE: indicates that the I-BUS is written completely into the INPUT/OUTPUT CELLs,
I-READ: indicates that the I-BUS has completely read the INPUT/OUTPUT CELLs,
E-WRITE: indicates that the E-BUS has been written completely into the INPUT/OUTPUT CELLs,
E-READ: indicates that the E-BUS has completely read the INPUT/OUTPUT CELLs.

In the example embodiment, the EB-REG is always active only on the side of the E-BUS SLAVE, and the E-BUS MASTER has read-write access to it.

All I-... records are written by E-BUS SLAVE and read by E-BUS MASTER.
All E-... records are written by E-BUS MASTER and read by E-BUS SLAVE.

An E-BUS SLAVE can request control of the E-BUS by setting the REQ MASTER bit in its EB-REG. If the E-BUS MASTER recognizes the REQ MASTER bit, it relinquishes the bus control as soon as possible. The E-BUS MASTER relinquishes the bus control by setting the MASTER bit in the EB-REG of an E-BUS SLAVE. The E-BUS MASTER then immediately switches the E-BUS to passive mode. The old E-BUS SLAVE becomes the new E-BUS MASTER, and the old E-BUS MASTER becomes the new E-BUS SLAVE. The new E-BUS MASTER assumes control of the E-BUS. To recognize the first E-BUS MASTER after a RESET of the system, there is a terminal on each unit which indicates by the preset polarity whether the unit is E-BUS MASTER or E-BUS SLAVE after a RESET. The MASTER record in the EB-REG can also be set and reset by the PLU. In the example embodiment, the PLU must be sure that there are no bus collisions on the EB-BUS and that no ongoing transfers are interrupted.

E-BUS MASTER Writes Data to E-BUS SLAVE

In the example embodiment of the present invention, the E-BUS MASTER can write data to the E-BUS SLAVE as follows:

The data transfer begins when the state machine of the E-BUS MASTER selects an OUTPUT CELL that is not masked out.
Data has already been stored in the I-GATE REG, depending on the design of the state machine, or the data is stored now.
The gate is activated.
The valid read address is transferred to the bus.
The data goes to the E-BUS and is stored in the E-GATE REG of the E-BUS SLAVE.
The SET-REG in the E-BUS SLAVE is thus activated.
The gate in the E-BUS MASTER is deactivated.
The address counter generates the address for the next access.
The transfer is terminated for the E-BUS MASTER.

There are two possible embodiments of the E-BUS SLAVE for transferring data from the bus to the unit:
1. The data gate is always open and the data goes directly from the E-GATE-REG to the I-BUSn.
2. The state machine recognizes that SET-REG is activated, and it activates the gate, so that SET-REG can be reset.

The E-BUS MASTER can notify the E-BUS SLAVE when a complete bus cycle is terminated (a bus cycle is defined as the transfer of multiple data strings to different E-GATE-REGs, where each E-GATE-REG may be addressed exactly once).

The E-BUS MASTER sets the E-WRITE bit in the EB-REG of the E-BUS SLAVE at the end of a bus cycle.
The E-BUS SLAVE can respond by polling the INPUT CELLs.
When it has polled all the INPUT CELLs, it sets the I-READ bit in its EB-REG.
It then resets E-WRITE and all the SET-REGs of the INPUT CELLS.
The E-BUS MASTER can poll I-READ and begin a new bus cycle after its activation.
I-READ is reset by E-WRITE being written or the first bus transfer.

The E-BUS SLAVE can analyze whether the INPUT CELLs can/must be read again on the basis of the status of the EB-REG or the individual SET-REGs of the INPUT CELLs.

E-BUS MASTER Reads Data from E-BUS SLAVE:

From the standpoint of the E-BUS MASTER, there are two basic methods of reading data from the E-BUS SLAVE:
1. Method in which the E-BUS Data Goes Directly to the I-BUS:
The data transfer begins with the state machine of the E-BUS MASTER selecting an INPUT CELL which is not masked out.
The I-GATE and the ADR-GATE are activated.
The valid read address is transferred to the bus.
The I-GATE-REG is transparent, i.e., it allows the data through to the I-BUSn.
The gate in the E-BUS MASTER is deactivated.
The address counter generates the address for the next access.
The transfer is terminated for the E-BUS MASTER.
2. Method in which the E-BUS Data is Stored Temporarily in the I-GATE-REG:
The data transfer begins with the state machine of the E-BUS MASTER selecting an INPUT CELL which is not masked out.
The I-GATE and the ADR-GATE are activated.
The valid read address is transferred to the bus.
I-GATE-REG stores the data.
The gate in the E-BUS MASTER is deactivated.
The address counter generates the address for the next access.

The E-BUS transfer is terminated for the E-BUS MASTER.

All INPUT CELLS involved in the E-BUS transfer, which can be ascertained on the basis of the masks in the MODE PLUREG or the state of the SET-REG, are run through and the data is transferred to the respective I-BUS.

For the E-BUS SLAVE, the access looks as follows:

The gate is activated by the E-BUS.

The data and the state of any SET-REG that may be present go to the E-BUS.

The gate is deactivated.

The E-BUS MASTER can notify the E-BUS SLAVE when a complete bus cycle is terminated.

To do so, at the end of a bus cycle, the E-BUS MASTER sets the E-READ bit in the EB-REG of the E-BUS SLAVE.

E-BUS SLAVE can react by writing to the OUTPUT CELLs anew.

When it has written to all the OUTPUT CELLs, it sets the I-WRITE bit in its EB-REG.

In doing so, it resets E-READ and all the SET-REGs of the OUTPUT CELLS.

The E-BUS MASTER can poll I-WRITE and begin a new bus cycle after its activation.

I-WRITE is reset by writing E-READ or the first bus transfer.

E-BUS SLAVE can evaluate on the basis of the state of the EB-REG or the individual SET-REGs of the OUTPUT CELLS whether the OUTPUT CELLs can/must be written anew.

Connection of Memory Devices and Peripherals, Cascading:

In addition to cascading identical units (DFPs, FPGAs, DPGAs), memories and peripherals can also be connected as lower-level SLAVE units (SLAVE) to the bus system described here. Memories and peripherals as well as other units (DFPs, FPGAs) can be combined here. Each connected SLAVE analyzes the addresses on the bus and recognizes independently whether it has been addressed. In these modes, the unit addressing the memory or the peripheral, i.e., the SLAVE units, is the bus MASTER (MASTER), i.e., the unit controls the bus and the data transfer. The exception is intelligent peripheral units, such as SCSI controllers that can initiate and execute transfers independently and therefore are E-BUS MASTERs.

Through the method described here, bus systems can be connected easily and efficiently to DFPs and FPGAs. Both memories and peripherals as well as other units of the types mentioned above can be connected over the bus systems.

The bus system need not be implemented exclusively in DFPs, FPGAs and DPGAs. Hybrid operation of this bus system with traditional unit terminal architectures is of course possible. Thus the advantages of the respective technique can be utilized optimally.

Other sequencing methods are also possible for the bus system described here. However, they will not be detailed here because they are free embodiment options that do not depend on the basic principle described here.

DESCRIPTION OF THE FIGURES

FIG. 1 shows a conventional FPGA, where 0101 represents the internal bus systems, 0102 includes one or more FPGA cells. 0103 denotes subbuses which are a subset of 0101 and are connected to 0101 via switches (crossbars). 0103 can also manage internal data of 0102 that are not switched to 0101. The FPGA cells are arranged in a two-dimensional array. 0104 is an edge cell located at the edge of the array and is thus in direct proximity to the terminals at the edge of the unit.

Figure 2:
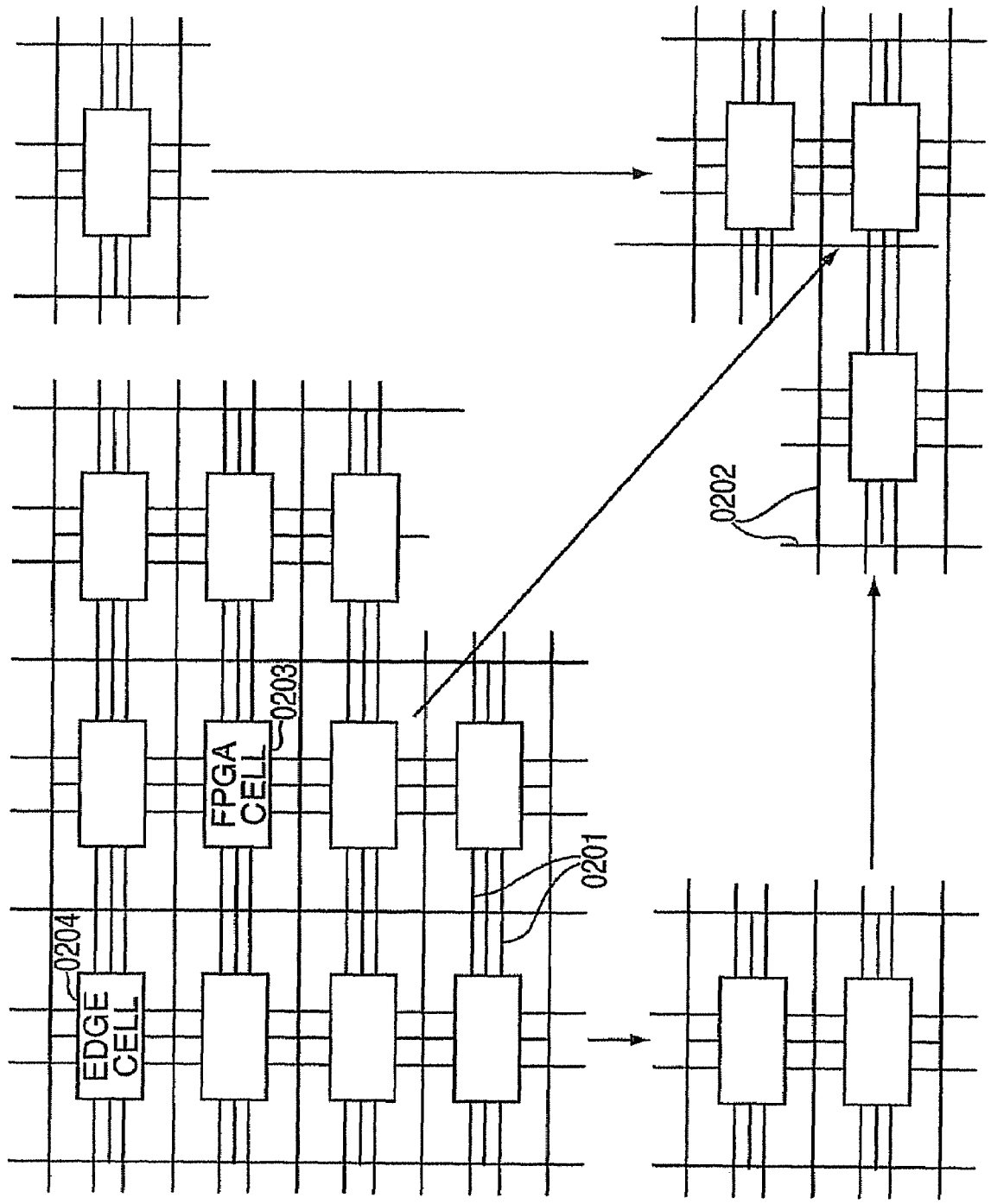
FIG. 2 shows an example of a basic unit as a type B FPGA.

FIG. 2 shows another conventional FPGA. This embodiment does not work with bus systems like 0101 but instead mainly with next-neighbor connections (0201), which are direct connections from an FPGA cell (0203) to a neighboring cell. There may be global bus systems (0202) nevertheless, although they are not very wide. The FPGA cells or a group of FPGA cells have a connection to 0202. The FPGA cells are arranged in a two-dimensional array. 0204 is an edge cell located at the edge of the array and thus in close proximity to the terminals at the edge of the unit.

Figure 3:
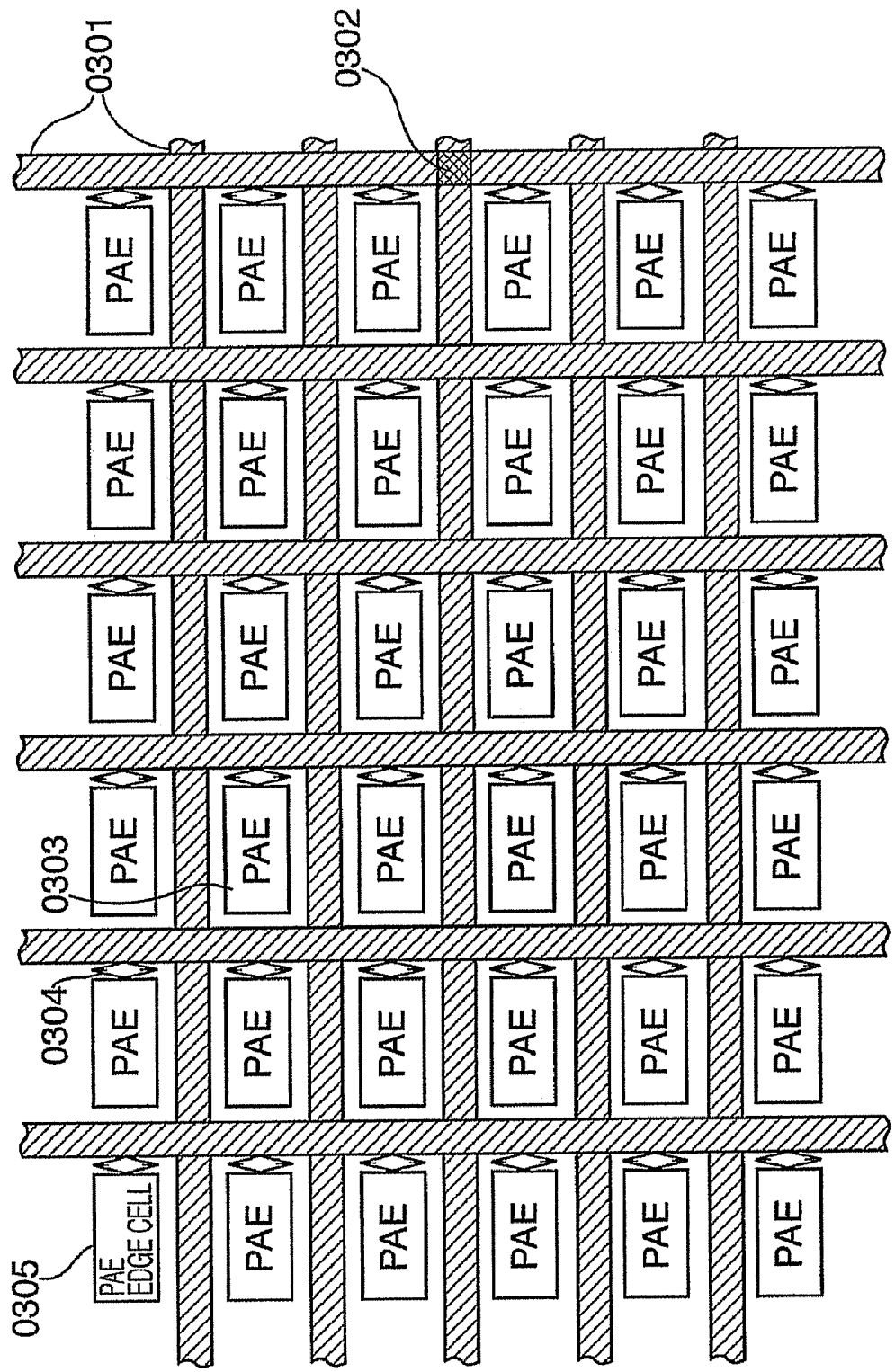
FIG. 3 shows an example of a basic unit as a DFP.

FIG. 3 shows a DFP described in, for example, German Patent No. 196 51 075.9. The PAE cells (0303) are wired to the bus systems (0301) via a bus interface (0304). Bus systems 0301 can be wired together via a bus switch (0302). The PAE cells are arranged in a two-dimensional array. 0305 is an edge cell located on the edge of the array and is thus in close proximity to the terminals at the edge of the unit.

FIG. 4a shows an FPGA edge according to FIG. 1. Outside the edge cells (0401) there are arranged a plurality of INPUT/OUTPUT CELLs (0402) connecting the internal bus systems (0403) individually or in groups to the E-BUS (0404). The number of INPUT/OUTPUT CELLs depends on their own width in relation to the width of the internal bus systems. 0405 is an EB-REG. 0406 is a state machine. A bus system (0407) by means of which the state machine controls the INPUT/OUTPUT CELLs runs from the state machine to the EB-REG and each individual INPUT/OUTPUT CELL. There may be several 0405s and 0406s by combining a number of 0402s into groups, each managed by a 0405 and 0406.

FIG. 4b shows an FPGA edge according to FIG. 2. Several INPUT/OUTPUT CELLs (0412) are arranged outside the edge cells (0411) and are connected individually or in groups to the E-BUS (0414) via the internal bus systems (0413) and the direct connections of the edge cells (0417). The number of INPUT/OUTPUT CELLs depends on their own width in relation to the width of the internal bus systems (0413) and the number of direct connections (0418). 0415 is an EB-REG. 0416 is a state machine. A bus system (0417) by means of which the state machine controls the INPUT/OUTPUT CELLs goes from the state machine to the EB-REG and each individual INPUT/OUTPUT CELL. There may be multiple 0415s and 0416s by combining a number of 0412s into groups, each managed by a 0415 and 0416.

FIG. 5 shows a DFP edge according to FIG. 3. Outside the edge cells (0501) are arranged several INPUT/OUTPUT CELLs (0502) which are connected individually or in groups to the E-BUS (0504) by the internal bus systems (0503). The number of INPUT/OUTPUT CELLs depends on their own width in relation to the width of the internal bus systems (0503). 0505 is an EB-REG. 0506 is a state machine. The state machine controls the INPUT/OUTPUT CELLs via a bus system (0507) which goes from the state machine to the EB-REG and each individual INPUT/OUTPUT CELL. There may be multiple 0505s and 0506s by combining a number of 0412s into groups, each managed by a 0505 and 0506.

Figure 6:
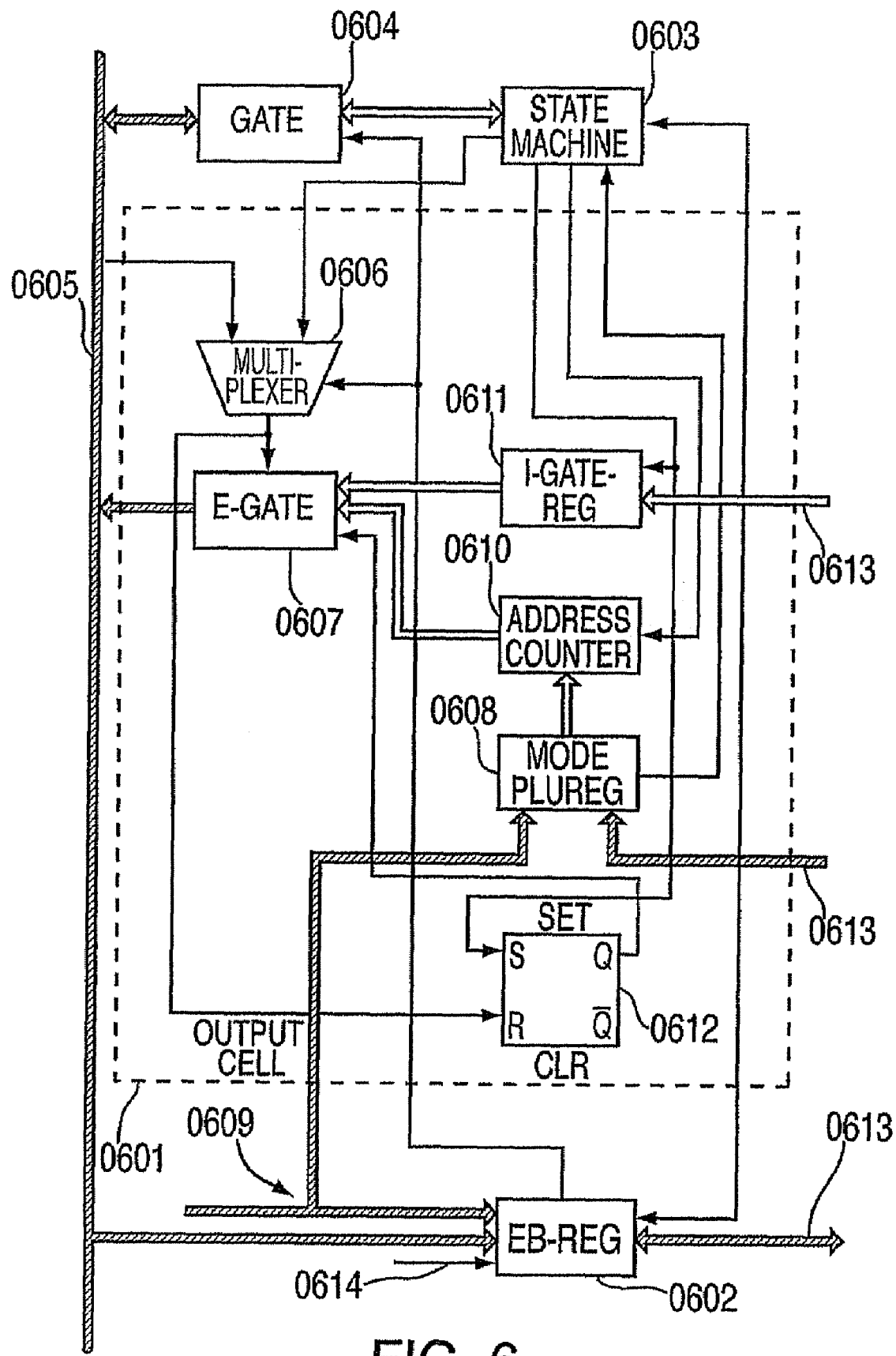
FIG. 6 shows an example of an OUTPUT CELL according to an example embodiment of the present invention.

FIG. 6 shows an OUTPUT CELL 0601. Outside of 0601 there are the EB-REG (0602) and the state machine (0603) plus a gate (0604) which connects the state machine to the E-BUS (0605) if it is the E-BUS MASTER. Access to the EB-REG is possible via the E-BUS (0605), the I-BUS (0613) and the PLU bus (0609). In addition, when the unit is reset, the MASTER bit can be set via an external terminal (0614) leading out of the unit. The state machine (0603) has read-write access to 0602. In the OUTPUT CELL there is a multiplexer (0606) which assigns control of the E-GATE (0607) to either the E-BUS MASTER or the state machine (0603). The MODE PLUREG (0608) is set via the PLU bus (0609) or the I-BUS (0613) and it configures the address counter (0610) and the state machine (e.g., masking out the OUTPUT CELL). If data of the I-BUS (0613) is stored in the I-GATE-REG (0611), the access is noted in SET-REG (0612). The state of 0612 can be polled via 0607 on the E-BUS. Read access (E-GATE 0607 is activated) resets 0612. The addresses generated by 0610 and the data of 0611 are transferred to the E-BUS via gate 0607. There is the possibility of dynamically reconfiguring and controlling the OUTPUT CELL via the unit itself (DFP, FPGA, DPGA, etc.) rather than through the PLU. The I-BUS connection to the EB-REG (0602) and MODE PLUREG (0608) serves this function.

Figure 7:
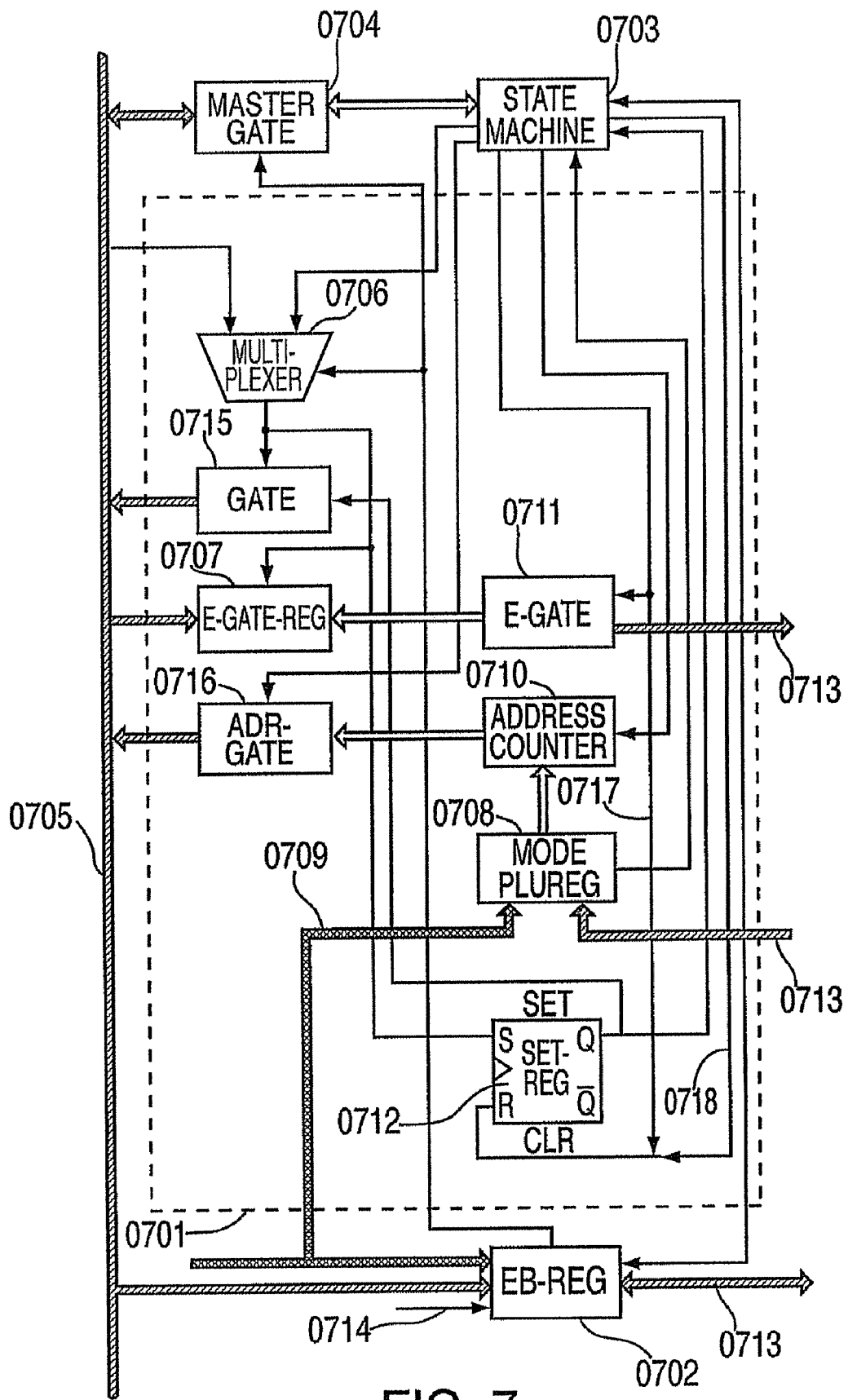
FIG. 7 shows an example of an INPUT CELL according to an example embodiment of the present invention.

FIG. 7 shows an INPUT CELL 0701. Outside of 0701 there are the EB-REG (0702) and the state machine (0703), as well as a gate (MASTER GATE) (0704) which connects the state machine to the E-BUS (0705) if it is in the E-BUS MASTER mode. Access to EB-REG is possible via the E-BUS (0705), the I-BUS (0713) and the PLU bus (0709). Furthermore, when the unit is reset, the MASTER bit can be set via an external terminal (0714) leading out of the unit. The state machine (0703) has read-write access to 0702. In the INPUT CELL there is a multiplexer (0706) which assigns control of the E-GATE-REG (0707) to either the E-BUS MASTER or the state machine (0703). The MODE PLUREG (0708) is set via the PLU bus (0709) or the I-BUS (0713) and configures the address counter (0710) and the state machine (e.g., masking out the INPUT CELL). If data of the E-BUS (0705) is stored in the E-GATE-REG (0707), this access is noted in the SET-REG (0712). The state of 0712 can be polled on the E-BUS via a gate (0715) whose control is the same as that of the latch (0707). A read access—E-GATE 0711 is activated and the data goes to the I-BUS (0713)—resets 0712 via 0717. As an alternative, 0712 can be reset (0718) via the state machine (0703).

The addresses generated by 0710 are transferred via the gate (ADR-GATE) 0716 to the E-BUS. 0716 is activated by the state machine (0703) when it is the E-BUS MASTER. There is the possibility of dynamically reconfiguring and controlling the INPUT CELL via the unit itself (DFP, FPGA, DPGA, etc.) instead of through the PLU. The I-BUS connection to the EB-REG (0702) and the MODE PLUREG (0708) serves this function.

Figure 8:
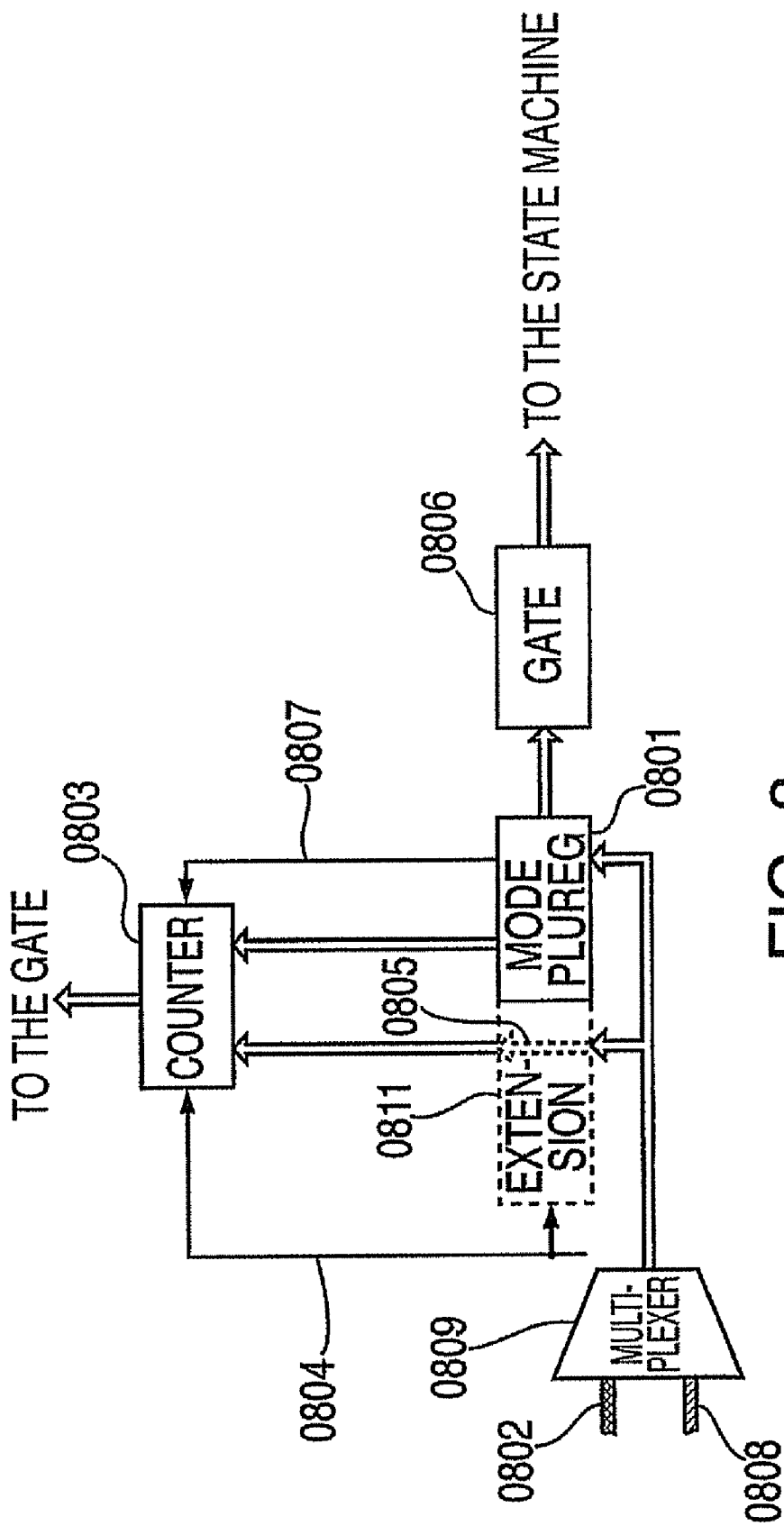
FIG. 8 shows an example of address generation in accordance with an example embodiment of the present invention.

FIG. 8 shows the MODE PLUREG (0801) of an INPUT or OUTPUT CELL written by the PLU via the PLU bus (0802) or via an I-BUS (0808). The respective bus system is selected by the multiplexer (0809) (control of the multiplexer is not shown because an ordinary decoder logic can be used). The counter settings such as step length, counting direction and enabling of the counter are sent directly (0807) to the counter (0803). The basic address can either be written directly (0805) to the counter via a load (0804) or stored temporarily in an extension (0811) of 0801. Records in 0801 that are relevant for the state machine go to the state machine via a gate (0806) which is opened by the state machine for the INPUT or OUTPUT CELL activated at the time.

FIG. 9*a* shows a bus interface circuit with a state machine (0901), MASTER GATE (0902) and EB-REG (0903). INPUT CELLs (0904) transfer data from the E-BUS (0905) to the II-BUS (0906). OUTPUT CELLs (0907) transfer data from the IO-BUS (0908) to the E-BUS (0905). All units are linked together by the control bus (0909).

FIG. 9*b* shows a bus interface circuit with a state machine (0901), MASTER GATE (0902) and EB-REG (0903). INPUT CELLs (0904) transfer data from the E-BUS (0905) to the bidirectional I-BUS (0910). OUTPUT CELLS (0907) transfer data from the bidirectional I-BUS (0910) to the E-BUS (0905). All units are linked together over the control bus (0909). Interface circuits utilizing both possibilities (FIGS. 9*a* and 9*b*) in a hybrid design are also conceivable.

Figure 10A:
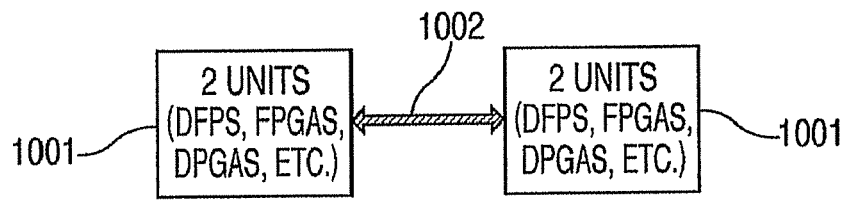
FIG. 10 shows an example of a connection of memories and peripherals in accordance with an example embodiment of the present invention.

FIG. 10*a* shows the interconnection of two units (DFPs, FPGAs, DPGAs, etc.) (1001) linked together via the E-BUS (1002).

Figure 10B:
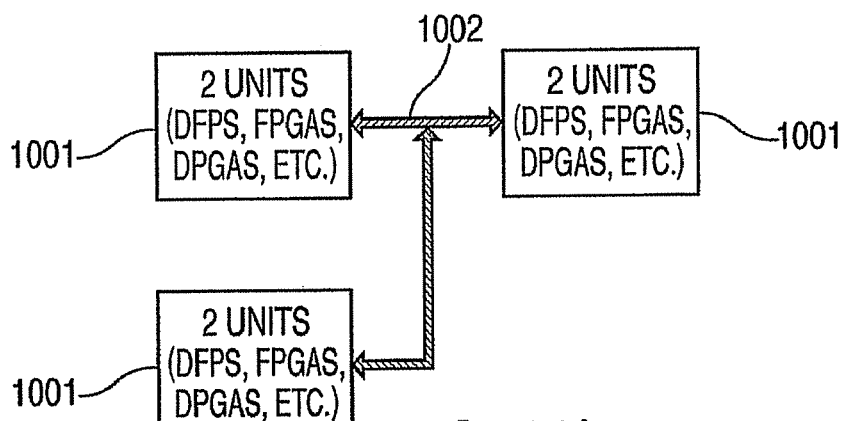

FIG. 10*b* shows the interconnection of a number of units (DFPs, FPGAs, DPGAs, etc.) (1001) via the E-BUS (1002).

Figure 10C:
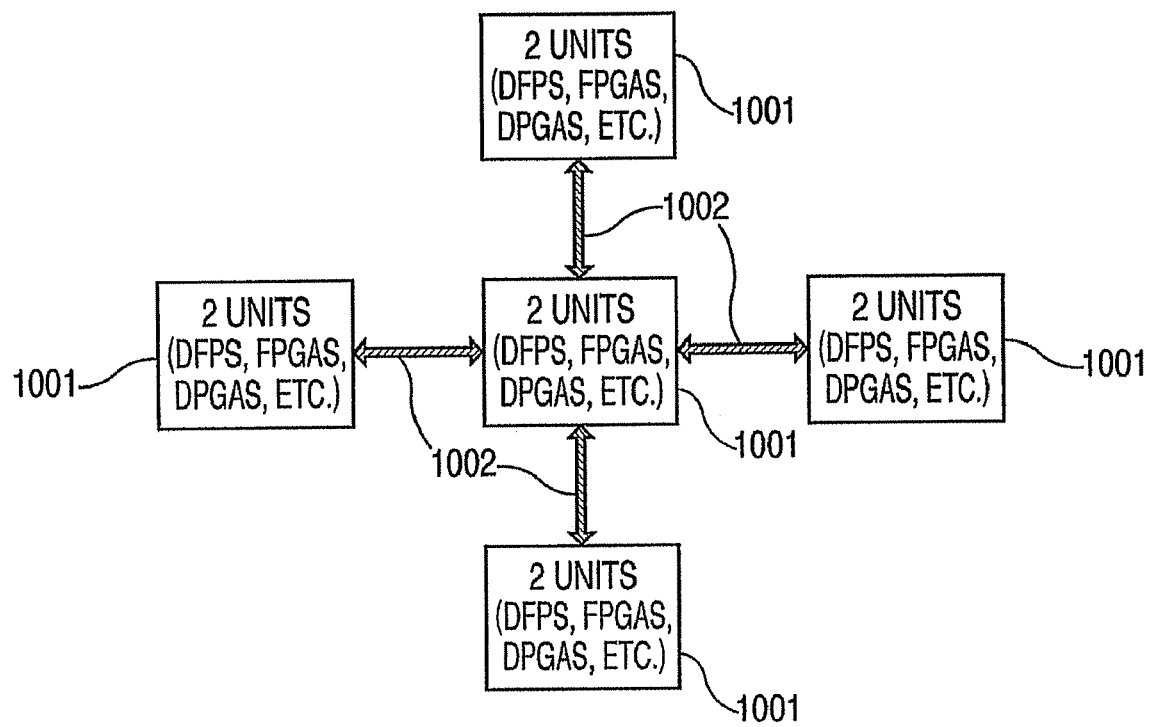

FIG. 10*c* shows the interconnection of a number of units (DFPs, FPGAs, DPGAs, etc.) (1001) via the E-BUS (1002). This interconnection can be expanded to a matrix. One unit (1001) may also manage multiple bus systems (1002).

Figure 10D:
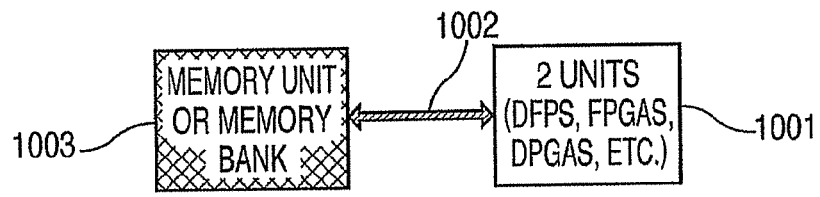

FIG. 10*d* shows the interconnection [of a] unit (DFP, FPGA, DPGA, etc.) (1001) to a memory unit or a memory bank (1003) via the E-BUS (1002).

Figure 10E:
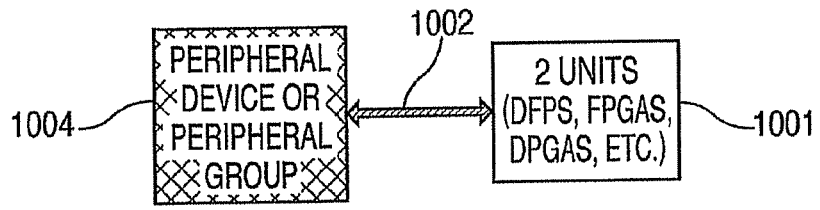

FIG. 10*e* shows the interconnection [of a] unit (DFP, FPGA, DPGA, etc.) (1001) to a peripheral device or a peripheral group (1004) via the E-BUS (1002).

Figure 10F:
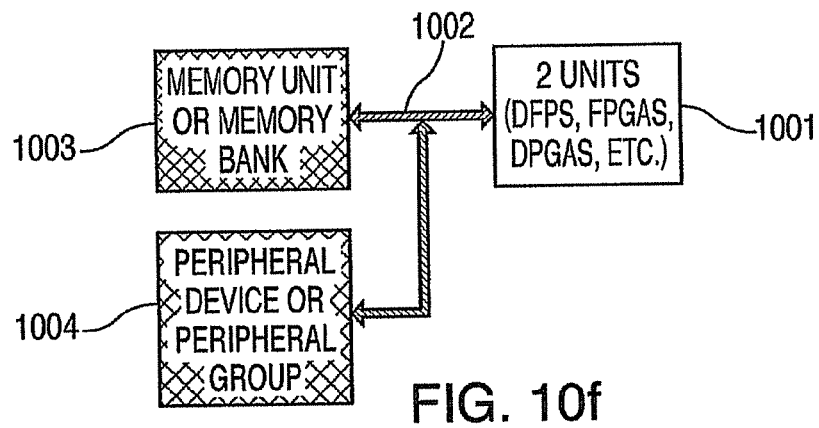

FIG. 10*f* shows the interconnection [of a] unit (DFP, FPGA, DPGA, etc.) (1001) to a memory unit or a memory bank (1003) and to a peripheral device or a peripheral group (1004) via the E-BUS (1002).

Figure 10G:
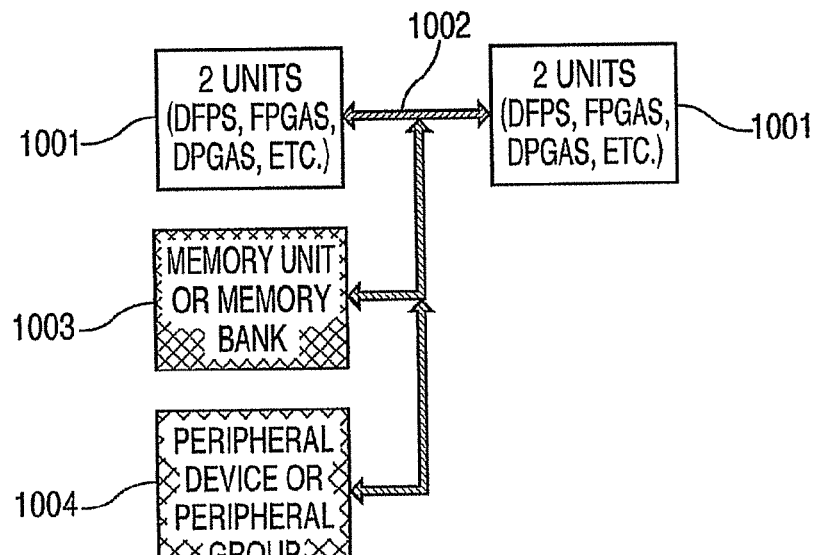

FIG. 10*g* shows the interconnection [of a] unit (DFP, FPGA, DPGA, etc.) (1001) to a memory unit or a memory bank (1003) and to a peripheral device or a peripheral group (1004) plus another unit (DFP, FPGA, DPGA, etc.) (1001) via the E-BUS (1002).

Figure 11:
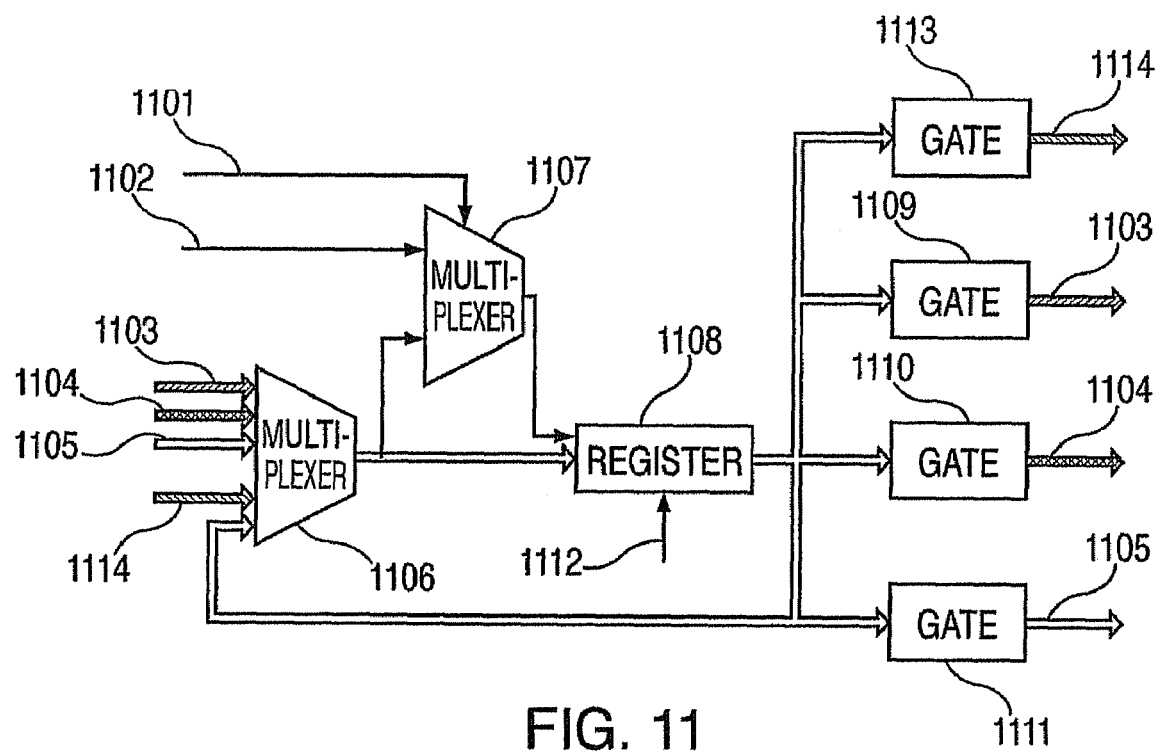
FIG. 11 shows an example of an EB-REG in accordance with an example embodiment of the present invention.

FIG. 11 shows the architecture of the EB-REG. The bus systems E-BUS (1103), the PLU bus (1104) over which the PLU has access to the EB-REG, and the local internal bus between the INPUT/OUTPUT CELLs, the state machine and the EB-REG (1105, see 0407, 0417, 0517) and possibly an I-BUS (1114) are connected to a multiplexer (1106). The multiplexer (1106) selects either one of the buses or feedback to the register (1108) and switches the data through to the input of the register (1108). The MASTER bit is sent to the register (1108) separately over the multiplexer (1107). The multiplexer is controlled by the RESET signal (1101) (resetting or initializing the unit). If a RESET signal is applied, the multiplexer (1107) switches the signal of an external chip connection (1102) through to the input of the register (1108); otherwise the output of the multiplexer (1106) is switched through to the input of the register (1108). MASTER may thus be pre-allocated. The register (1108) is clocked by the system clock (1112). The contents of the register (1108) are switched via a gate (1109, 1110, 1111, 1113) to the respective bus system (1103, 1104, 1105, 1114) having read access at that time. Control of the gates (1109, 1110, 1111, 1113) and of the multiplexer (1106) is not shown because an ordinary decoder logic may be used.

EMBODIMENTS

Figure 12:
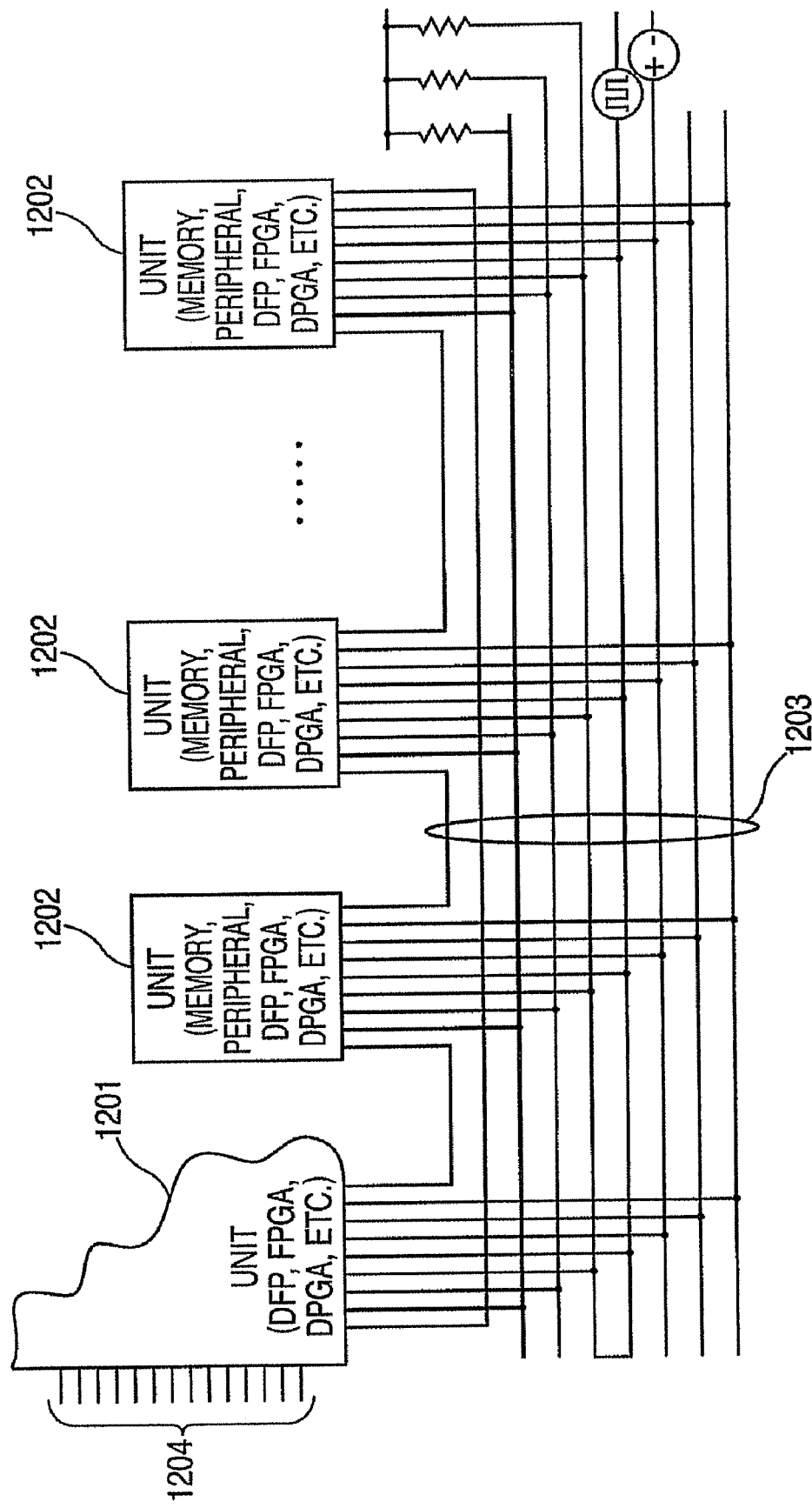
FIG. 12 shows an example embodiment of the present invention using a RAMBUS.

FIG. 12 shows an example embodiment using a standard bus system RAMBUS (1203). One unit (DFP, FPGA, DPGA, etc.) (1201) is connected to other units (memories, peripherals, other DFPs, FPGAs, DPGAs, etc.) (1202) by the bus system (1203). Independently of the bus system (1203), this unit (1201) may have additional connecting lines (1204), e.g., for connecting any desired circuits, as is customary in the related art.

Figure 13:
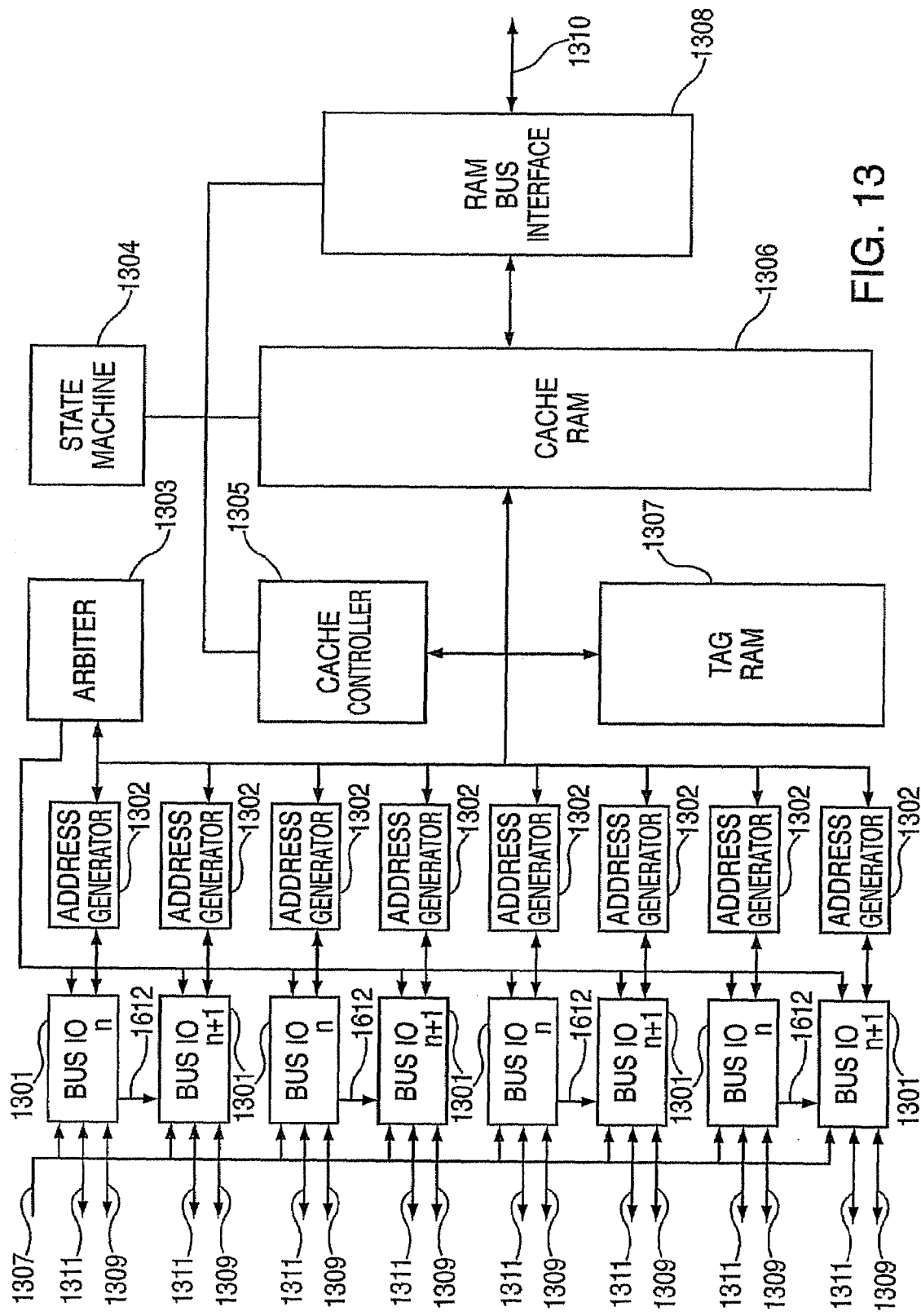
FIG. 13 shows an example implementation of an IO and memory bus system according to the present invention.

FIG. 13 shows an example of implementation of an IO and memory bus system. 1310 forms the RAM bus connecting RAM bus interface (1308) to the RAM bus memory. The RAM bus interface is connected to a cache RAM (1306). A tag RAM (1307) and a cache controller (1305) are provided for cache RAM (1306). With the help of the cache controller and tag RAM, a check is performed to determine whether the required data is in the cache memory or whether it must be loaded out of the external RAM bus memory. Cache RAM, cache controller and RAM bus interface are controlled by a state machine (1304). The cache is a known implementation.

Arbiter (1303) regulates access of individual bus segments to the cache RAM and thus also to external memory. In this exemplary implementation, access to eight bus segments is possible. Each connection to a bus segment (1309) has a bus IO (1301) and an address generator (1302). In addition, each bus IO is also connected to the primary logic bus (1307) and to an internal test bus (1311). Every n-th bus IO is connected to the (n+1)-th bus IO, where n is defined as n=(1, 3, 5, ...). Through this connection, data requested from memory by the n-th address generator is used by the (n+1)-th segment as the address for a memory access. Indirect addressing of the memory is thus possible. The value of the counter (1509) of segment n indicates a memory location in the RAM. Data from this memory location is transferred to segment (n+1), where it serves as the basic address for addressing the memory.

Figure 14:
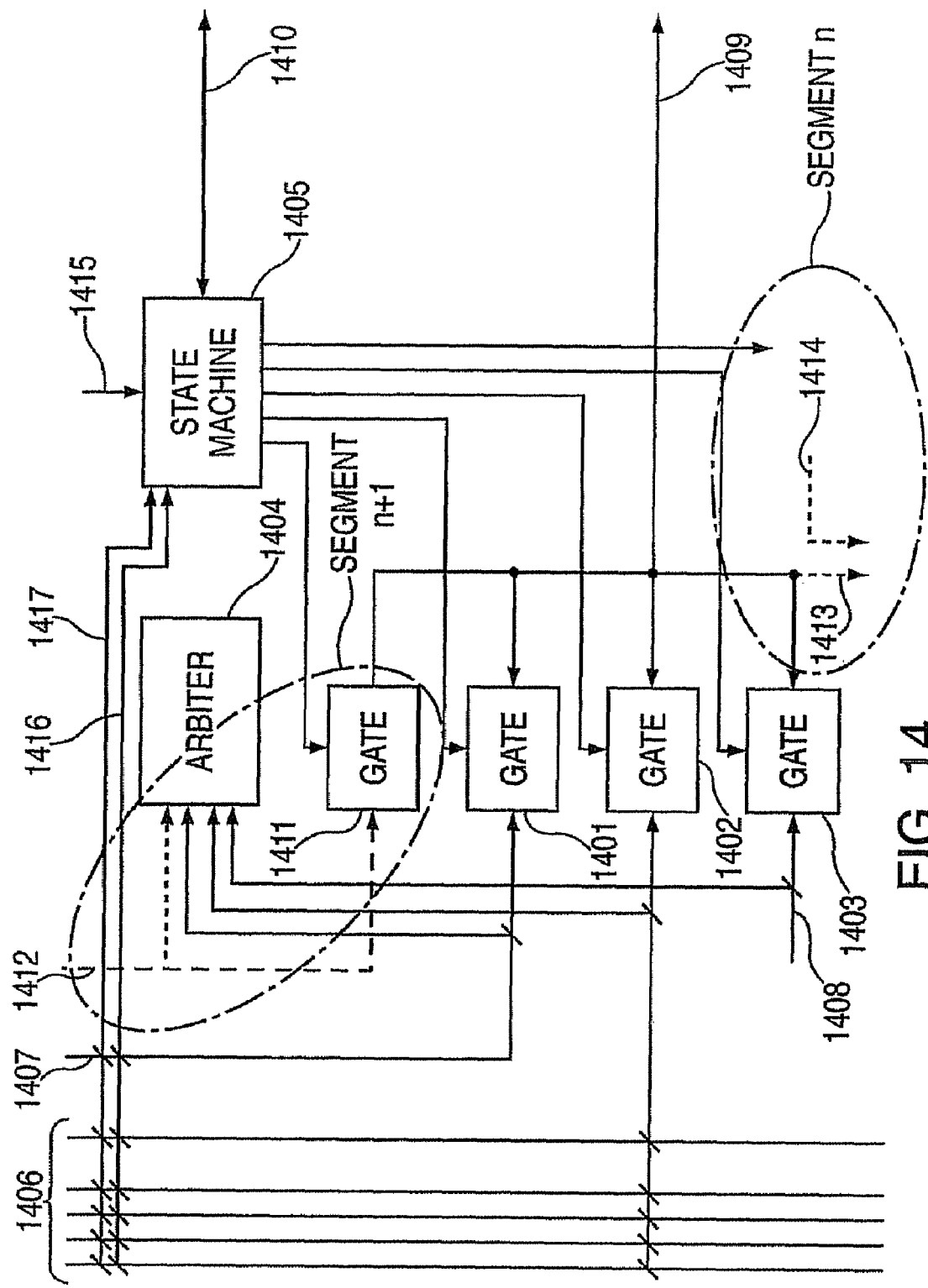
FIG. 14 shows an example Bus IO according to the present invention.

FIG. 14 shows an example bus IO unit. It is connected to the internal bus system (1406), the test bus system (1408) and the primary logic bus (1407). According to an example embodiment, bus (1412) and bus (1413) serve to connect the n-th bus 10 to the (n+1)-th bus IO. In other words, bus (1413) is present only with every n-th segment, and bus (1412) is present only with every (n+1)-th segment. The n-th bus 10 sends data over the bus (1413), and the (n+1)-th bus 10 receives this data over the bus (1412). Bus systems (1406, 1407, 1412) are connected by gates (1401, 1402, 1403, 1411) to bus (1409) which connects the bus 10 to the address generator. The arbiter (1404) selects a bus system (1406, 1407, 1412) for data transmission and delivers a control signal to the state machine (1405) which in turn controls gates (1401, 1402, 1403, 1411). In addition, state machine (1405) also sends control signals (1410) to the address generator and RAM.

Two example possibilities are as follows:

a) Segment n: State machine (1405) receives from the address generator a configuration signal (1415) which determines whether indirect addressing is to take place. After a read trigger signal (1416) from internal bus (1406) or primary logic bus (1407), state machine (1405) enables the respective gate (1401, 1402, 1403, 1411) and generates control signals (1410). The memory location addressed by the loadable incrementer/decrementer (1509) is read out. Data contained in the RAM memory location is not sent back to the bus but instead is transmitted by the bus (1413) to the (n+1)-th segment, where it serves as a basic address for addressing the RAM. After having received data from the RAM, the state machine (1405) delivers an acknowledge signal for synchronization to state machine (1414), which controls the sequence in indirect addressing. This state machine (1414) is referred to below as ind state machine. It generates all the necessary control signals and sends them to the following segment (1413).

b) Segment (n+1): The (n+1)-th segment receives data transmitted from the n-th segment over the bus (1412). Arbiter (1404) receives a write signal and sends a request to the state machine, which enables gate (1411). Gate (1411) adds the internal address of the basic address entry to the data from 1412, so that decoder (1502) enables the basic address latches.

Figure 15A:
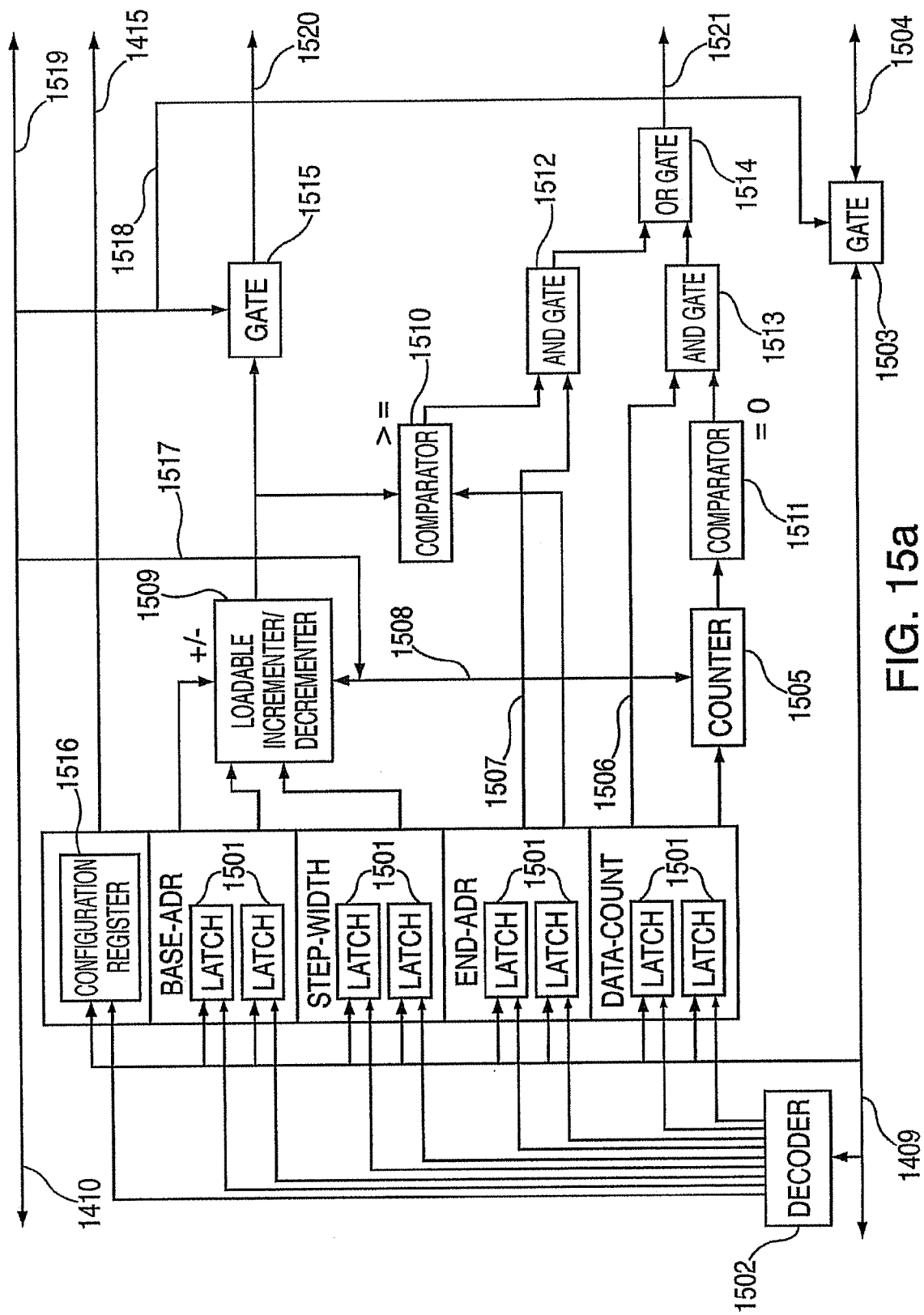
FIG. 15a shows an example address generator according to the present invention.

FIG. 15a shows the address generator. Data and address information is transmitted from the bus IO to the address generator over the bus (1409). Bus (1410) transmits control signals CLK (1517, 1508) and the output enable signal (1518) as well as control signals to RAM (1519). The output enable signal (1518) enables the gates (1503, 1515). Gate (1503) switches data from bus (1409) to data bus (1504) to the RAM. Gate (1515) switches the addresses thus generated to address bus (1520) leading to the RAM.

Addresses are generated as follows: Four entries in the address generator generate addresses. Each entry is stored in two latches (1501), with one latch storing the higher-order address and the other latch storing the lower-order address. The basic address entry contains the start address of a memory access. The step width entry is added to or subtracted from the basic address in loadable incrementer/decrementer (1509). The (incrementing/decrementing) function of loadable incrementer/decrementer (1509) is coded in one bit of the basic address and transmitted to loadable incrementer/decrementer (1509).

The end address is stored in the end address entry, and one bit is encoded according to whether address generation is terminated on reaching the end address or whether the end address entry is ignored. If the counter counts up to an end address, the value of the end address entry is compared with the initial value of the loadable incrementer/decrementer. This takes place in the comparator (1510), which generates a high as soon as the end address is reached or exceeded. With an active enable end address signal (1507), the AND gate (1512) delivers this high to the OR gate (1514), which then relays a trigger signal (1521) to the primary logic bus.

The data count entry contains the number of data transfers and thus of the addresses to be calculated. Here again, one bit in the data count entry determines whether this function is activated and the enable data counter signal (1506) is sent to the AND gate (1513) or whether the data count entry is ignored. Counter (1505) receives the value of the data count entry and decrements it by one with each clock pulse. Comparator (1511) compares the value of counter (1505) [with] zero and delivers a signal to AND gate (1513). If enable data counter signal (1506) is active, the signal of comparator (1511) is sent to OR gate (1514) and as trigger signal (1521) to the primary logic bus.

Bus (1409) contains control signals and addresses for the decoder (1502), which selects one of the latches (1501) according to the address. Configuration register (1516) can also be controlled by decoder (1502), determining whether the segment is used for indirect addressing. Data of the configuration register is transmitted to the bus IO of the segment over connection (1415).

Figure 15B:
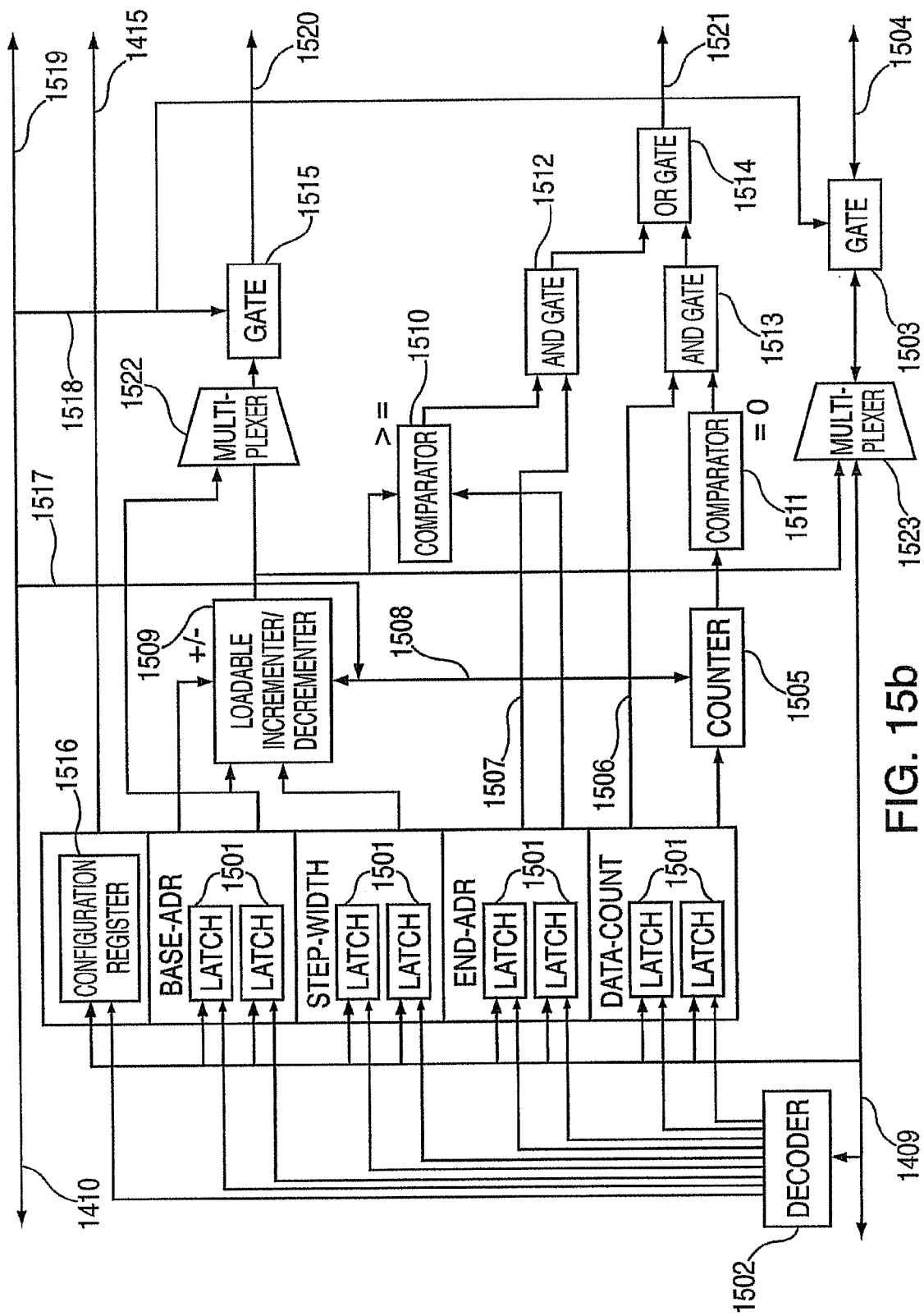
FIG. 15b shows another example address generator according to the present invention, generating end-of-data identification.

FIG. 15b shows a modification of the address generator from FIG. 15a, which deposits the end address of the data block at the beginning of a data block in the memory. The advantage of this design is that (with) a variable size of the data block, the end is defined precisely for subsequent access. This structure corresponds basically to the structure of the address generator from FIG. 15a, but with the addition of two multiplexers (1522, 1523) and an additional entry in the configuration register (1523). This entry is called the calculate end address and determines whether the end address of the data block is deposited as the first entry of the data block at the location defined by the base address entry. These multiplexers are controlled by state machine (1405). Multiplexer (1522) serves to switch the basic address or output of counter (1509) to gate (1515). Multiplexer (1523) switches either data coming from bus (1404) or the output of counter (1509) to gate (1503).

Figure 15C:
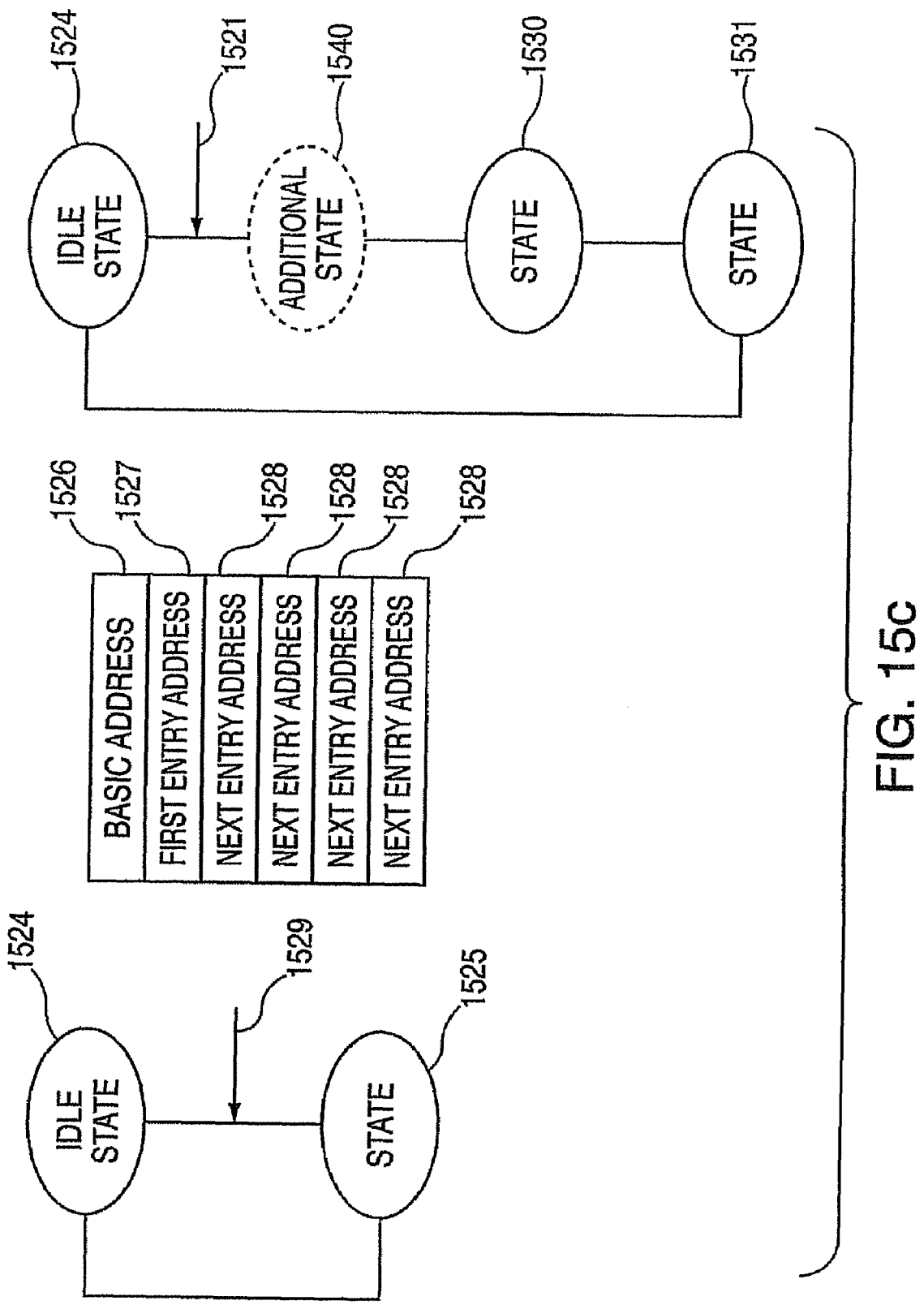
FIG. 15c shows an example function sequence with the address generator with end-of-data identification according to the present invention.

FIG. 15c shows the sequence in the state machine and the pattern of memory access by the address generator shown in FIG. 15b. State machine (1405) is first in the IDLE state (1524). If the calculate end address entry is set in configuration register (1523), after writing step width (1529), state machine (1405) goes into state (1525) where the address for RAM access is written into the loadable incrementer/decrementer from the basic address entry, and the step width is added or subtracted, depending on counter mode (incrementing/decrementing). The RAM is accessed and the state machine returns to IDLE state (1524). The following data transfers are performed as specified by the basic addresses and step width entries. The pattern in memory is thus as follows. Basic address (1526) has not been written. First entry (1527) is in the position defined by the basic address plus (minus) the step width. The next entries (1528) follow one another at step width intervals.

When the end of the transfer has been reached, a trigger signal is generated (1521). On the basis of the trigger signal (1521) or an external trigger signal (1417), state machine (1405) goes from IDLE state (1524) into state (1530), where multiplexers (1522, 1523) are switched, so that the basic address is applied to the input of gate (1515), and the address is applied to gate (1503) after the end of the data block. Then state machine (1405) enters state (1531) and writes the address to the RAM at the position of the basic address after the end of the data block. The pattern in memory is then as follows. The entry of basic address (1526) indicates the address after the end of the data block. The first entry in the data block is at address (1527), and then the remaining entries follow. Another possible embodiment of the state machine is for the state machine to first correct the count in 1509 on the basis of one of trigger signals (1521 or 1417) so that 1509 indicates the last data word of the data block. This is implemented technically by performing the inverse operation to that preset in 1509, i.e., if 1509 adds the step width according to the presettings, the step width is now subtracted; if 1509 subtracts according to the presettings, it is added. To perform the correction, an additional state (1540) is necessary in the state machine described below in conjunction with FIG. 15c to control 1509 accordingly.

Figure 16:
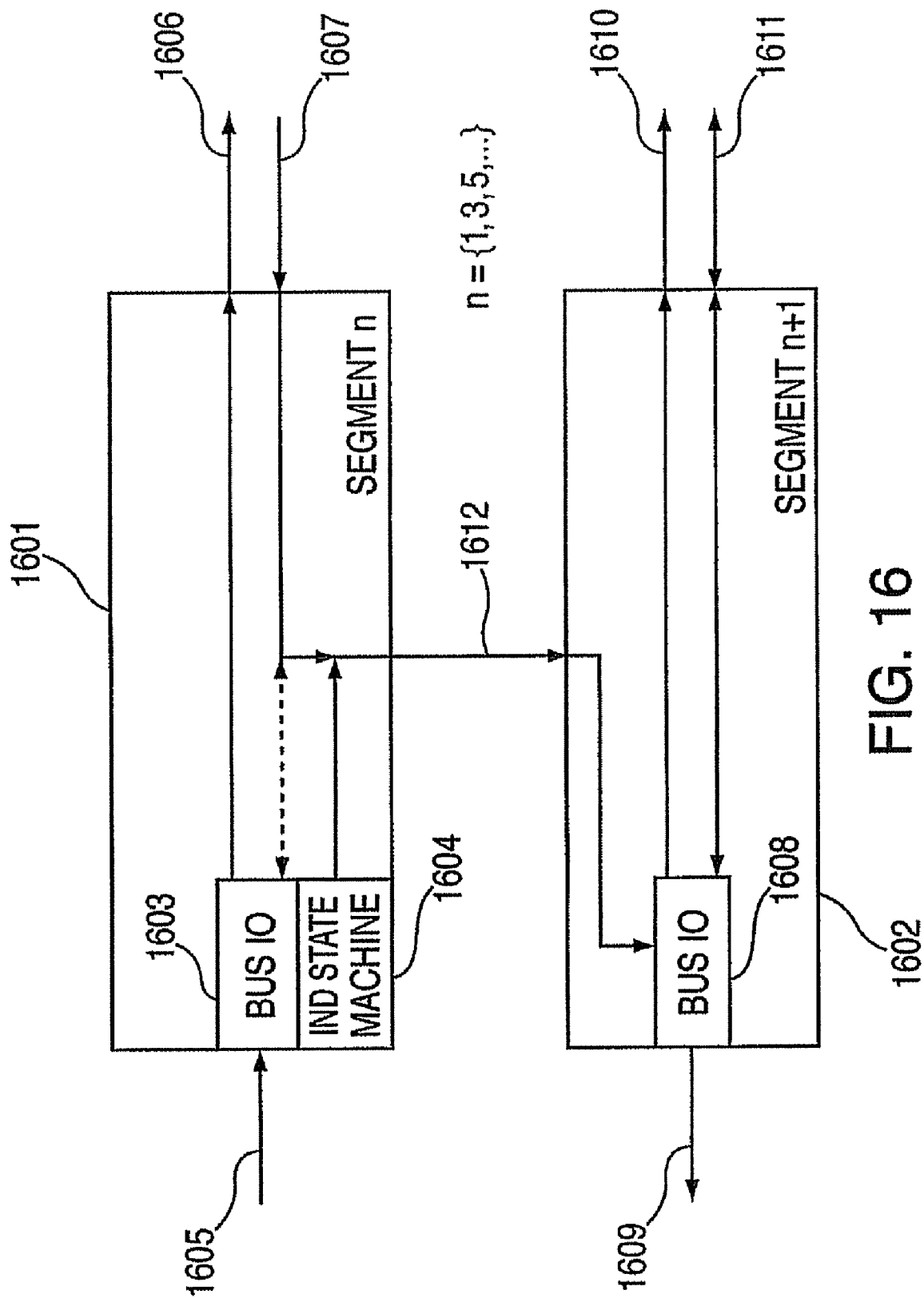
FIG. 16 shows an interaction of two segments in indirect addressing according to an example embodiment of the present invention.

FIG. 16 shows the interaction of multiple segments in indirect addressing. Segment n (1601) receives a read signal over the bus (1605) (primary logic bus (1407) or internal bus (1406)). Bus IO (1603) enables the respective gate and generates the required control signals. The memory location determined by 1509 is addressed. Data (1607) coming from the RAM is sent to segment (n+1) (1602). Ind state machine (1604) generates the required control signals and likewise sends them to segment (n+1) (1602). In segment (n+1) (1602), signals pass through gate (1411) of bus IO (1608) described in conjunction with FIG. 14, where an address is added for decoder (1502) described in conjunction with FIG. 15, so that the basic address entry of the address generator (1608) is addressed by segment (n+1) (1602). Data coming from segment n (1601) thus serves as the basic address in segment (n+1) (1602), i.e., read-write access over bus (1609) (primary logic bus (1407) or internal bus (1406)) can use this basic address for access to the RAM. Bus (1610) serves to transmit addresses to the RAM, and bus (1612) transmits data to and from the RAM, depending on whether it is a read or write access.

Figure 17:
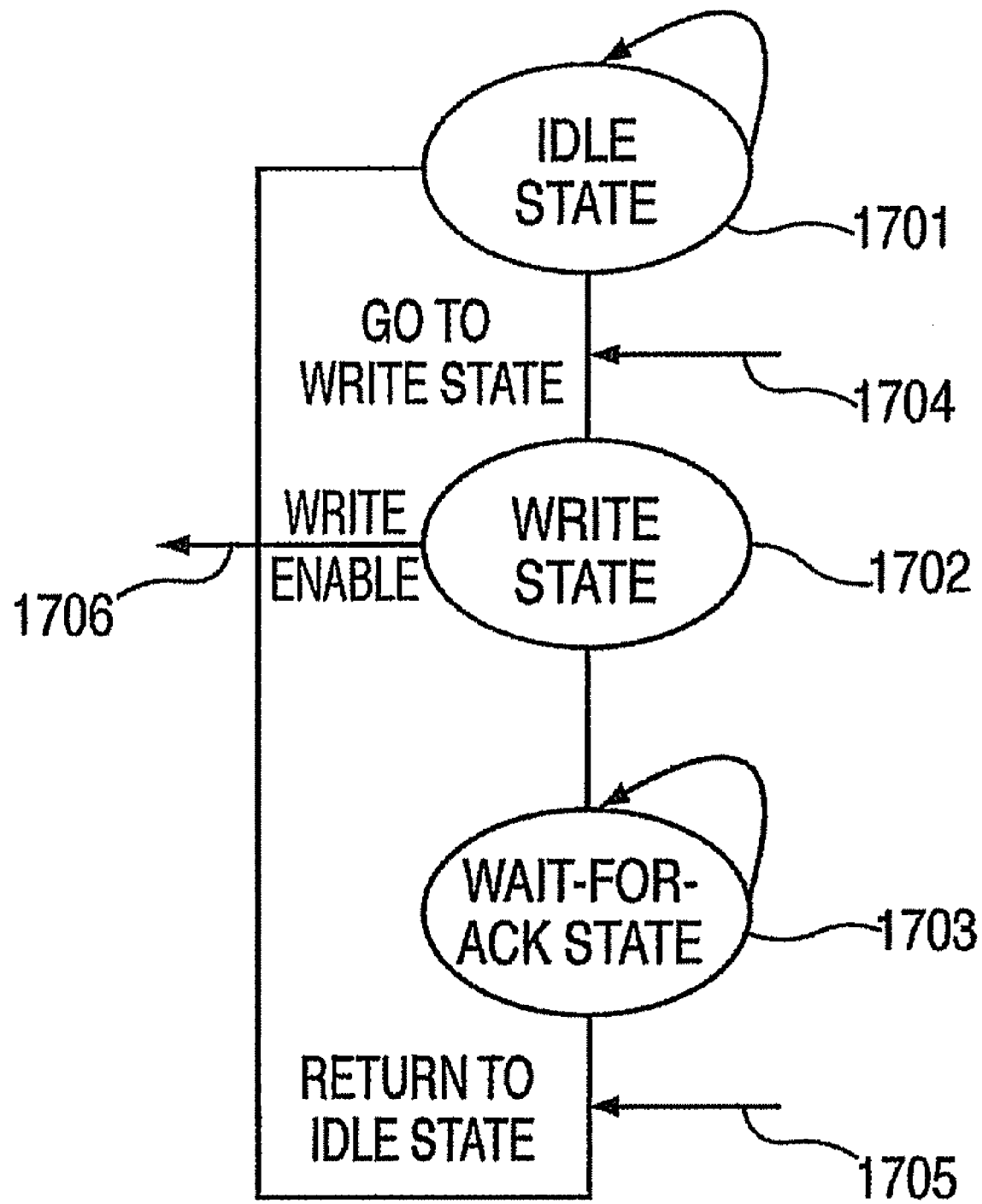
FIG. 17 shows an example state machine for indirect addressing according to the present invention.

FIG. 17 illustrates the ind state machine. The basic state is the IDLE state (1701). It remains in this state until the acknowledge signal of state machine (1405) from FIG. 14 arrives. Then ind state machine goes into a write state (1702), generating a write enable signal which is sent with the data to segment (n+1), where it serves to activate the decoder selecting the various entries. Next it enters a wait_for_ack state. After the acknowledge signal of segment (n+1), the ind state machine returns to the IDLE state (1701).

DEFINITION OF TERMS

ADR-GATE: Gate which switches addresses to the E-BUS if the unit is in E-BUS MASTER mode.
DFP: Data flow processor according to German Patent DE 44 16 881.
DPGA: Dynamically programmable gate array. Related art.
D flip-flop: Storage element which stores a signal at the rising edge of a clock pulse.
EB-REG: Register that stores the status signals between I-BUS and E-BUS.
E-BUS: External bus system outside a unit.
E-BUS MASTER: Unit that controls the E-BUS. Active.
E-BUS SLAVE: Unit controlled by the E-BUS MASTER. Passive.
E-GATE: Gate which is controlled by the internal state machine of the unit or by the E-BUS MASTER and switches data to the E-BUS.
E-GATE-REG: Register into which data transmitted to the E-BUS over the E-GATE is entered.
E-READ: Flag in the EB-REG indicating that the OUTPUT CELLS have been transferred completely to the E-BUS.
E-WRITE: Flag in the EB-REG indicating that the E-BUS has been transferred completely to the INPUT CELLS.
Flag: Status bit in a register, indicating a state.
FPGA: Field programmable gate array. Related art.
Handshake: Signal protocol where a signal A indicates a state and another signal B confirms that it has accepted signal A and responded to it.
INPUT CELL: Unit transmitting data from the E-BUS to an I-BUS.
I-BUSn (also I-BUS): Internal bus system of a unit, which may also consist of bundles of individual lines, where n indicates the number of the bus.
II-BUSn (also II-BUS): Internal bus system of a unit, which may also consist of bundles of individual lines, with n denoting the number of the bus. The bus is driven by an INPUT CELL and goes to logic inputs.
IO-BUSn (also IO-BUS): Internal bus system of a unit, which may also consist of bundles of individual lines, with n denoting the number of the bus. The bus is driven by logic outputs and goes to an OUTPUT CELL. n indicates the number of the bus.
I-GATE: Gate that switches data to the I-BUS.
I-GATE-REG: Register which is controlled by the internal state machine or by E-BUS MASTER and into which data transmitted over the I-GATE to the I-BUS is entered.
I-READ: Flag in the EB-REG indicating that the INPUT CELLs have been completely transferred to the I-BUS.
I-WRITE: Flag in the EB-REG indicating that the I-BUS has been completely transferred to the OUTPUT CELLs.
Edge cell: Cell at the edge of a cell array, often with direct contact with the terminals of a unit.
Configuring: Setting the function and interconnecting a logic unit, a (FPGA) cell (logic cell) or a PAE (see reconfiguring).
Primary logic unit (PLU): Unit for configuring and reconfiguring a PAE or logic cell. Configured by a microcontroller specifically designed for this purpose.
Latch: Storage element which usually relays a signal transparently during the H level and stores it during the L level. Latches where the function of levels is exactly the opposite are sometimes used in PAEs. An inverter is then connected before the clock pulse of a conventional latch.

Logic cells: Configurable cells used in DFPs, FPGAs, DPGAs, fulfilling simple logical or arithmetic functions, depending on configuration.

MASTER: Flag in EB-REG showing that the E-BUS unit is a MASTER.

MODE PLUREG: Register in which the primary logic unit sets the configuration of an INPUT/OUTPUT CELL.

OUTPUT CELL: Unit that transmits data from an I-BUS to the E-BUS.

PAE: Processing array element: EALU with O-REG, R-REG, R20-MUX, F-PLUREG, M-PLUREG, BM UNIT, SM UNIT, sync UNIT, state-back UNIT and power UNIT.

PLU: Unit for configuring and reconfiguring a PAE or a logic cell. Configured by a microcontroller specifically designed for this purpose.

REQ-MASTER: Flag in the EB-REG indicating that the unit would like to become E-BUS MASTER.

RS flip-flop: Reset/set flip-flop. Storage element which can be switched by two signals.

SET-REG: Register indicating that data has been written in an I-GATE-REG or E-GATE-REG but not yet read.

STATE-GATE: Gate switching the output of the SET-REG to the E-BUS.

Gate: Switch that relays or blocks a signal. Simple comparison: relay.

Reconfiguring: New configuration of any number of PAEs or logic cells while any remaining number of PAEs or logic cells continue their own function (see configuring).

State machine: Logic which can assume miscellaneous states. The transitions between states depend on various input parameters. These machines are used to control complex functions and belong to the related art.

What is claimed is:

1. A Field Programmable Gate Array (FPGA) based configurable data processing integrated circuit, comprising:
   a high level configuration load unit;
   a plurality of configurable cells arranged in a two dimensional array;
   configurable individual lines interconnecting the configurable cells within the array; and
   at least one interface unit that:
      at least one of is coupled to and combines the individual lines and thereby defines a device internal bus system;
      comprises a self-contained external bus interfacing to at least one of external memories and external peripherals;
      is implemented as a dedicated hardwired interface unit separate from the plurality of configurable cells;
      is configurable by at least one of the high level configuration load unit and at least some of the plurality of configurable cells, and while the FPGA operates at runtime; and
      at least one of:
         (i) receives processing data, the processing data to be processed by the FPGA according to a configuration defined by configuration data; and
         (ii) transmits data processed by the FPGA, the processing by the FPGA being in accordance with the configuration defined by the configuration data.

2. The data processing integrated circuit of claim 1, wherein at least some of the plurality of cells are coarse-grained units.

3. The data processing integrated circuit of claim 2, wherein the at least one interface unit comprises an address arrangement to generate addresses for memories connected to the at least one interface unit.

4. The data processing integrated circuit of claim 2, wherein the at least one interface unit comprises an address arrangement to generate addresses for an external module.

5. The data processing integrated circuit of claim 1, wherein at least some cells are Arithmetic Logic Units (ALUs).

6. The data processing integrated circuit of claim 5, wherein the at least one interface unit comprises a protocol arrangement to generate protocols for at least one of an external module and an external bus.

7. The data processing integrated circuit of claim 5, wherein at least some cells are reconfigurable at runtime without disturbing other cells, so that processing by the other cells continues during the reconfiguration.

8. The data processing integrated circuit of claim 7, wherein the at least one interface unit provides a protocol arrangement to generate protocols for at least one of an external module and an external bus.

9. The data processing integrated circuit of claim 1, wherein at least some cells are reconfigurable at runtime without disturbing other cells, so that processing by the other cells continues during the reconfiguration.

10. The data processing integrated circuit of claim 9, wherein the at least one interface unit comprises a protocol arrangement to generate protocols for at least one of an external module and an external bus.

11. The data processing integrated circuit of claim 1, wherein the at least one interface unit comprises an address arrangement to generate addresses for an external module.

12. The data processing integrated circuit of claim 1, wherein the at least one interface unit comprises an address arrangement to generate addresses for memories connected to the at least one interface unit.

13. The data processing integrated circuit of any one of claims 3, 4, 11, and 12, wherein the address arrangement is configured to indicate an end of a data transfer via a signal on at least one of the internal and external bus.

14. The data processing integrated circuit of any one of claims 3, 4, 11, and 12, wherein the address arrangement has an initializable counter.

15. The data processing integrated circuit of any one of claims 3, 4, 11, and 12, wherein the address arrangement is configured to indicate an end of a data transfer via a signal on a bus.

16. The data processing integrated circuit of claim 1, wherein the at least one interface unit comprises a protocol arrangement to generate protocols for at least one of an external module and an external bus.

17. The data processing integrated circuit of any one of claims 1, 2, 5, 7, and 9, wherein the at least one interface unit comprises a protocol arrangement to generate protocols for an external module.

18. The data processing integrated circuit of any one of claims 1, 2, 5, 7, and 9, wherein the at least one interface unit comprises a protocol arrangement to generate protocols for the external bus.

19. The data processing integrated circuit of any one of claims 1, 2, 5, 7, and 9, further comprising:
   at least one state machine for controlling the at least one interface unit.

20. The data processing integrated circuit of claim 19, wherein the state machine is located within the dedicated hardwired interface unit.

21. The data processing integrated circuit of any one of claims 1, 2, 5, 7, and 9, further comprising:
   a cache system configured to cache at least one of reads from and writes to at least one of the external bus, a peripheral, and an external memory.

22. The data processing integrated circuit of claim 21, wherein the cache system is configured to cache reads from the external bus.

23. The data processing integrated circuit of claim 21, wherein the cache system is configured to cache reads from the peripheral.

24. The data processing integrated circuit of claim 21, wherein the cache system is configured to cache reads from the external memory.

25. The data processing integrated circuit of claim 21, wherein the cache system is configured to cache writes to the external bus.

26. The data processing integrated circuit of claim 21, wherein the cache system is configured to cache writes to the peripheral.

27. The data processing integrated circuit of claim 21, wherein the cache system is configured to cache writes to the external memory.

28. The data processing integrated circuit of claim 21, wherein the cache system is:
   communicatively arranged between (a) the internal bus and (b) the external bus; and
   configured to cache data to be requested via the external bus; and
   configured to provide a connection to the external bus, the connection being provided only for data that is one of not cached and not cacheable.

29. The data processing integrated circuit of any one of claims 1, 2, 5, 7, and 9, further comprising:
   a synchronization arrangement to synchronize the cell arrangement with at least one of an external module and the external bus.

30. The data processing integrated circuit of claim 29, wherein the synchronization arrangement is adapted to synchronize the cell arrangement with the external module.

31. The data processing integrated circuit of claim 29, wherein the synchronization arrangement is adapted to synchronize the cell arrangement with the external bus.

32. The data processing integrated circuit of any one of claims 1, 2, 5, 7, and 9, further comprising:
   at least one of (a) a plurality of internal buses and (b) a plurality of external buses; and
   an arrangement configured to connect a selected internal bus of the plurality of internal buses to a selected external bus of the plurality of external buses;
   wherein a number of the plurality of external buses is smaller than a number of the plurality of internal buses.

33. The data processing integrated circuit of claim 1, further comprising:
   a bus master coupled to the plurality of individual lines for controlling the bus system; and
   a plurality of slave units in communication with the bus master.

34. The data processing integrated circuit of claim 33, wherein a bus control is transferred dynamically between one of the plurality of slave units to another of the plurality of slave units.

35. The data processing integrated circuit of any one of claims 1, 2, 5, 7, and 9, further comprising:
   a register indicating whether data is stored in the at least one interface unit; and
   at least one register coupled to a first bus for managing and controlling the bus system.

36. The data processing integrated circuit of claim 29, wherein the synchronization arrangement is located within the dedicated hardwired interface unit.

37. The data processing integrated circuit of claim 1, wherein the interface unit comprises an address generator.

38. The data processing integrated circuit of claim 37, wherein the address generator is located within the dedicated hardwired interface unit.

39. The data processing integrated circuit of claim 2, wherein the data processing integrated circuit operates as one of an arithmetic processor and an arithmetic coprocessor.

40. The data processing integrated circuit of claim 39, wherein the at least one interface unit comprises an address arrangement to generate addresses for an external module, and the address arrangement is assigned to at least one of an internal bus system and a group of lines and is configured to address at least one memory.

41. The data processing integrated circuit of claim 39, wherein the at least one interface unit comprises an address arrangement to generate addresses for the external bus.

42. The data processing integrated circuit of claim 2, wherein the at least one interface unit comprises an address management for managing addresses transferred between the external bus and the at least one interface unit.

43. The data processing integrated circuit of claim 1, wherein the at least one interface unit comprises an address management for managing addresses transferred between the external bus and the at least one interface unit.

44. The data processing integrated circuit of any one of claims 1, 2, 5, 7, and 9, wherein the at least one interface unit comprises a protocol arrangement to generate protocols for the internal bus.

45. The data processing integrated circuit of any one of claims 1, 2, 5, 7, and 9, further comprising:
   at least one state machine for controlling the at least one of the internal and external bus.

46. A Field Programmable Gate Array (FPGA) Integrated Circuit, comprising:
   a configurable at least two-dimensional cell structure including configurable cells arranged in a two-dimensional array and including configurable internal individual lines interconnecting the configurable cells within the array; and
   at least one interface unit adapted for transferring via an external bus and at runtime:
      data to be processed, the data to be processed being transferred into the configurable cell structure from at least one external device; and
      processed data out of the configurable cell structure to said at least one external device;
   wherein the at least one interface unit is a dedicated hardwired unit separate from the configurable cells and includes:
      more than one internal data input for data transfer from said individual lines;
      more than one internal data output for data transfer to said individual lines;
      external connections for at least one external input and at least one external output; and
      a state machine.

47. The FPGA Integrated Circuit according to claim 46, wherein the FPGA Integrated Circuit is dynamically programmable.

48. The FPGA Integrated Circuit according to any one of claims 46 and 47, wherein the at least one interface unit allows for transmitting data while the FPGA operates as one of an arithmetic processor or an arithmetic coprocessor.

49. The FPGA Integrated Circuit according to any one of claims 46 and 47, wherein the at least one interface unit allows for transmitting data while the FPGA is processing algorithms.

50. The FPGA Integrated Circuit according to claim 49, wherein the at least one interface unit supports a connection of external memory.

51. The FPGA Integrated Circuit according to claim 50, wherein the at least one interface unit comprises an address generator.

52. The FPGA Integrated Circuit according to any one of claims 46 and 47, wherein the at least one interface unit comprises a protocol generator for at least one of the internal individual lines and the external bus.

53. The FPGA Integrated Circuit according to claim 49, wherein the at least one interface unit supports connecting peripherals.

54. The FPGA Integrated Circuit according to claim 53, wherein the at least one interface unit comprises an address generator.

55. The FPGA Integrated Circuit according to claim 49, wherein the at least one interface unit supports a connection of other processing devices.

56. The FPGA Integrated Circuit according to claim 55, wherein the at least one interface unit comprises an address generator.

57. The FPGA Integrated Circuit according to claim 49, wherein the at least one interface unit is connected to an internal cache.

58. The FPGA Integrated Circuit according to claim 49, wherein the at least one interface unit supports a connection to a cache.

59. A Field Programmable Gate Array (FPGA) Integrated Circuit comprising:
   a cell structure including (a) configurable cells arranged in a two-dimensional array and (b) a configurable internal interconnection connecting the configurable cells; and
   at least one interface unit that:
      is adapted for transferring via an external bus and at runtime:
         data to be processed, the data to be processed being transferred into the cell structure and from at least one external device; and
         processed data out of the cell structure to said at least one external device;
      has more than one internal data input for data transfer from said configurable internal interconnection, more than one internal data output for data transfer to said configurable internal interconnection, and external connections for at least one external input and at least one external output;
      is a dedicated hardwired unit separate from the plurality of configurable cells; and
      interfaces the configurable interconnection with the external bus via a plurality of terminals of the integrated circuit.

60. The FPGA Integrated Circuit according to claim 59, wherein the at least one interface unit comprises a state machine.

61. The FPGA Integrated Circuit according to claim 60, wherein the state machine controls internal data transfer.

62. The FPGA Integrated Circuit according to claim 60, wherein the state machine controls external data transfer.

63. The FPGA Integrated Circuit according to any one of claims 59 and 60, wherein the at least one interface unit allows for transmitting data while the FPGA Integrated Circuit operates as one of an arithmetic processor and an arithmetic coprocessor.

64. The FPGA Integrated Circuit according to any of claims 59 and 60, wherein the at least one interface unit allows for transmitting data while the FPGA Integrated Circuit is processing algorithms.

65. The FPGA Integrated Circuit according to claim 64, wherein the at least one interface unit supports connection of external memory.

66. The FPGA Integrated Circuit according to claim 65, wherein the at least one interface unit comprises an address generator.

67. The FPGA Integrated Circuit according to claim 59, wherein all signals to or from the external bus are transferred solely through the interface unit.

68. The FPGA Integrated Circuit according to claim 59, wherein the at least one interface unit comprises a protocol generator for at least one of the internal and external bus.

69. The FPGA Integrated Circuit according to claim 65, wherein the at least one interface unit supports connection of peripherals.

70. The FPGA Integrated Circuit according to claim 69, wherein the at least one interface unit comprises an address generator.

71. The FPGA Integrated Circuit according to claim 65, wherein the at least one interface unit supports connection of other processing devices.

72. The FPGA Integrated Circuit according to claim 71, wherein the at least one interface unit comprises an address generator.

73. The FPGA Integrated Circuit according to claim 65, wherein the at least one interface unit is connected to an internal cache.

74. The FPGA Integrated Circuit according to claim 65, wherein the at least one interface unit supports a connection to a cache.

75. The FPGA Integrated Circuit according to claim 59, wherein:
   the at least one interface unit allows for transmitting data while the FPGA Integrated Circuit is processing algorithms;
   the at least one interface unit supports connection of external memory; and
   the at least one interface unit comprises a state machine controlling data transfer.

76. The FPGA Integrated Circuit according to claim 59, wherein:
   the at least one interface unit allows for transmitting data while the FPGA Integrated Circuit is processing algorithms;
   the at least one interface unit supports connection of peripherals; and
   the at least one interface unit comprising a state machine controlling the data transfer.

77. The FPGA Integrated Circuit according to claim 59, wherein:
   the at least one interface unit allows for transmitting data while the FPGA Integrated Circuit is processing algorithms;
   the at least one interface unit supports connection of other processing devices; and
   the at least one interface unit comprising a state machine controlling the data transfer.

78. A Field Programmable Gate Array (FPGA) based configurable data processing integrated circuit, comprising:
- a high level configuration load unit;
- a two dimensional array of a plurality of configurable cells;
- configurable individual lines interconnecting the configurable cells within the array; and
- at least one interface unit that:
  - at least one of is coupled to and combines the individual lines and thereby defines a device internal bus system;
  - comprises a self-contained external bus interfacing to at least one of external memories and external peripherals;
  - is implemented as a dedicated hardwired interface unit separate from the array;
  - is configurable by at least one of the high level configuration load unit and at least some of the plurality of configurable cells; and
  - receives data from the array while the FPGA operates at runtime.

* * * * *